(12) United States Patent
Wu et al.

(10) Patent No.: US 11,923,187 B2
(45) Date of Patent: *Mar. 5, 2024

(54) CLEANING METHOD AND APPARATUS

(71) Applicant: TAIWAN SEMICONDUCTOR MANUFACTURING CO., LTD., Hsinchu (TW)

(72) Inventors: Min-Cheng Wu, Taitung County (TW); Chi-Hung Liao, New Taipei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/066,771

(22) Filed: Dec. 15, 2022

(65) Prior Publication Data

US 2023/0118862 A1    Apr. 20, 2023

Related U.S. Application Data

(63) Continuation of application No. 17/217,805, filed on Mar. 30, 2021, now Pat. No. 11,562,898, which is a continuation of application No. 16/243,726, filed on Jan. 9, 2019, now Pat. No. 10,971,352.

(60) Provisional application No. 62/698,297, filed on Jul. 16, 2018.

(51) Int. Cl.
| | |
|---|---|
| *H01L 21/02* | (2006.01) |
| *H01L 21/027* | (2006.01) |
| *H01L 21/324* | (2006.01) |
| *H01L 21/687* | (2006.01) |

(52) U.S. Cl.
CPC .... *H01L 21/02057* (2013.01); *H01L 21/0274* (2013.01); *H01L 21/324* (2013.01); *H01L 21/68707* (2013.01); *H01L 21/68742* (2013.01)

(58) Field of Classification Search
CPC .......... H01L 21/02057; H01L 21/0274; H01L 21/324; H01L 21/68707; H01L 21/68742; H01L 21/67115; H01L 21/67748; H01L 21/6838
See application file for complete search history.

(56) References Cited

U.S. PATENT DOCUMENTS

| | | |
|---|---|---|
| 10,831,068 B2 | 11/2020 | Huang |
| 2002/0067585 A1 | 6/2002 | Fujiwara |
| 2005/0030496 A1 | 2/2005 | Chibana |
| 2007/0151517 A1 | 7/2007 | Baik |
| 2008/0018868 A1 | 1/2008 | Yamamoto |

(Continued)

FOREIGN PATENT DOCUMENTS

| | | |
|---|---|---|
| CN | 1990903 A | 7/2007 |
| CN | 103472603 A | 12/2013 |

(Continued)

*Primary Examiner* — Deoram Persaud
(74) *Attorney, Agent, or Firm* — Maschoff Brennan

(57) ABSTRACT

A method includes transferring a wafer to a position over a wafer chuck; lifting a lifting pin through the wafer chuck to a first position to support the wafer; holding the wafer on the lifting pin using a negative pressure source in gaseous communication with an inner gas passage of the lifting pin; introducing a gas to a region between the wafer and the wafer chuck through an outer gas passage of the lifting pin, wherein in a top view of the lifting pin, the inner gas passage has a circular profile, while the outer gas passage has a ring-shape profile; and lowering the lifting to dispose the wafer over the wafer chuck.

20 Claims, 19 Drawing Sheets

(56) References Cited

U.S. PATENT DOCUMENTS

| | | |
|---|---|---|
| 2010/0133735 A1 | 6/2010 | Katsuta |
| 2010/0139702 A1 | 6/2010 | Namba |
| 2016/0111318 A1 | 4/2016 | Ichinose |
| 2016/0268157 A1 | 9/2016 | Gong |
| 2017/0076915 A1 | 3/2017 | Boyd, Jr. |
| 2018/0158717 A1 | 6/2018 | Hanzlik |
| 2019/0390337 A1 | 12/2019 | Mustafa |
| 2020/0083087 A1 | 3/2020 | Ni |

FOREIGN PATENT DOCUMENTS

| | | |
|---|---|---|
| CN | 105408991 A | 3/2016 |
| TW | 201810512 A | 3/2018 |

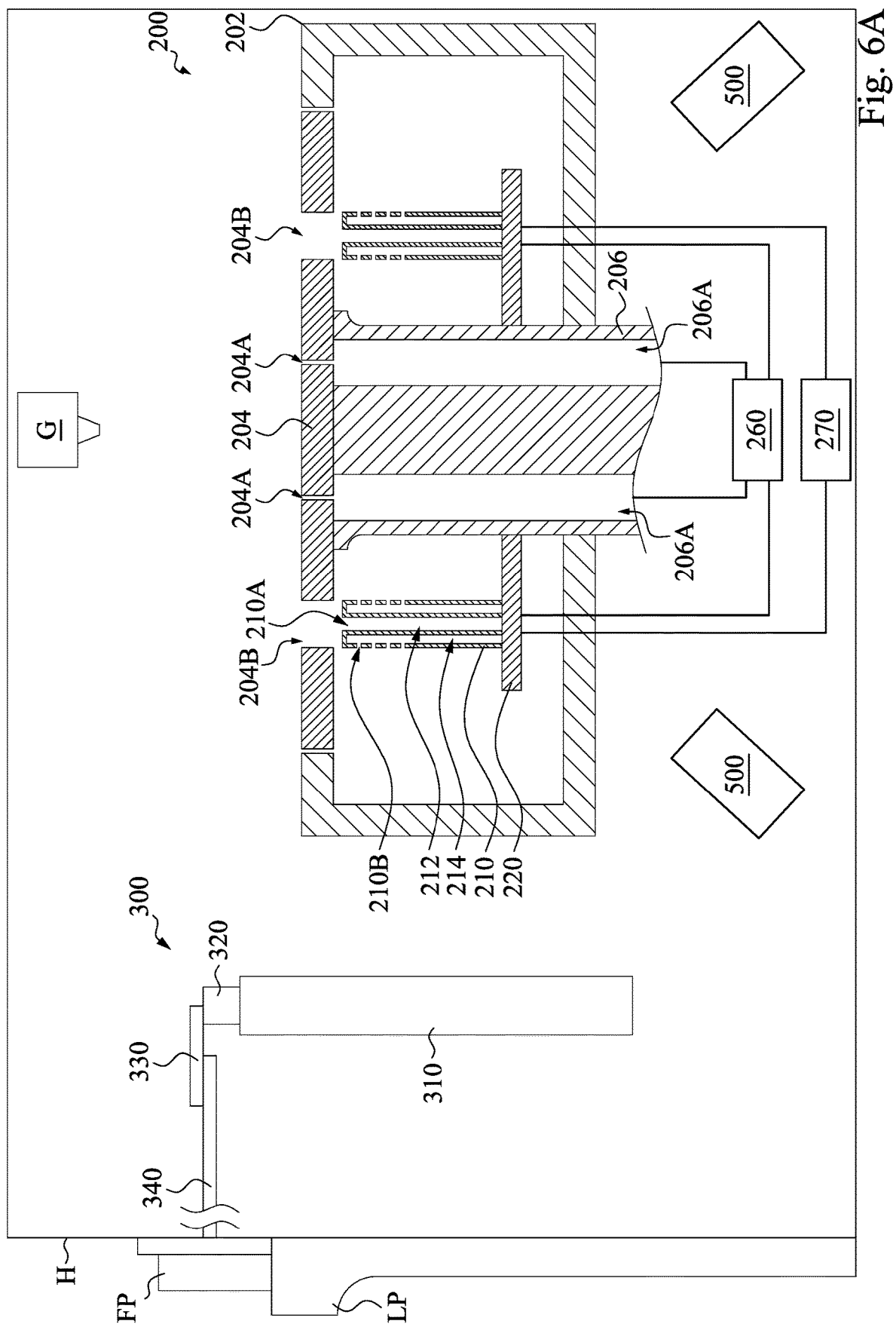

CLEANING METHOD AND APPARATUS

PRIORITY CLAIM AND CROSS-REFERENCE

The present application is a Continuation application of U.S. application Ser. No. 17/217,805, filed on Mar. 30, 2021, which is a Continuation application of U.S. application Ser. No. 16/243,726, filed on Jan. 9, 2019, now U.S. Pat. No. 10,971,352, issued on Apr. 6, 2021, which claims priority to U.S. Provisional Application Ser. No. 62/698,297, filed Jul. 16, 2018, which is herein incorporated by reference.

BACKGROUND

Semiconductor devices are manufactured after performing many processes such as depositing a material layer on a wafer, patterning the deposited material layer, and removing unnecessary residuals on the wafer. To perform these processes repeatedly, a wafer is loaded on a wafer stage inside a chamber, the wafer is processed, and then unloaded. In order to successively process a wafer, it is important to be able to mount a wafer on a chuck in the chamber and to remove the wafer therefrom without the wafer being damaged in the process. As semiconductor devices become highly integrated, the design rule becomes tighter, and the process margin becomes narrower. If the wafer is not mounted on a chuck properly, mask overlay and heating homogeneity may be impacted.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A to 6G are wafer holding apparatus at various stages of operation in accordance with some embodiments of the present disclosure.

DETAILED DESCRIPTION

Figure 1A:
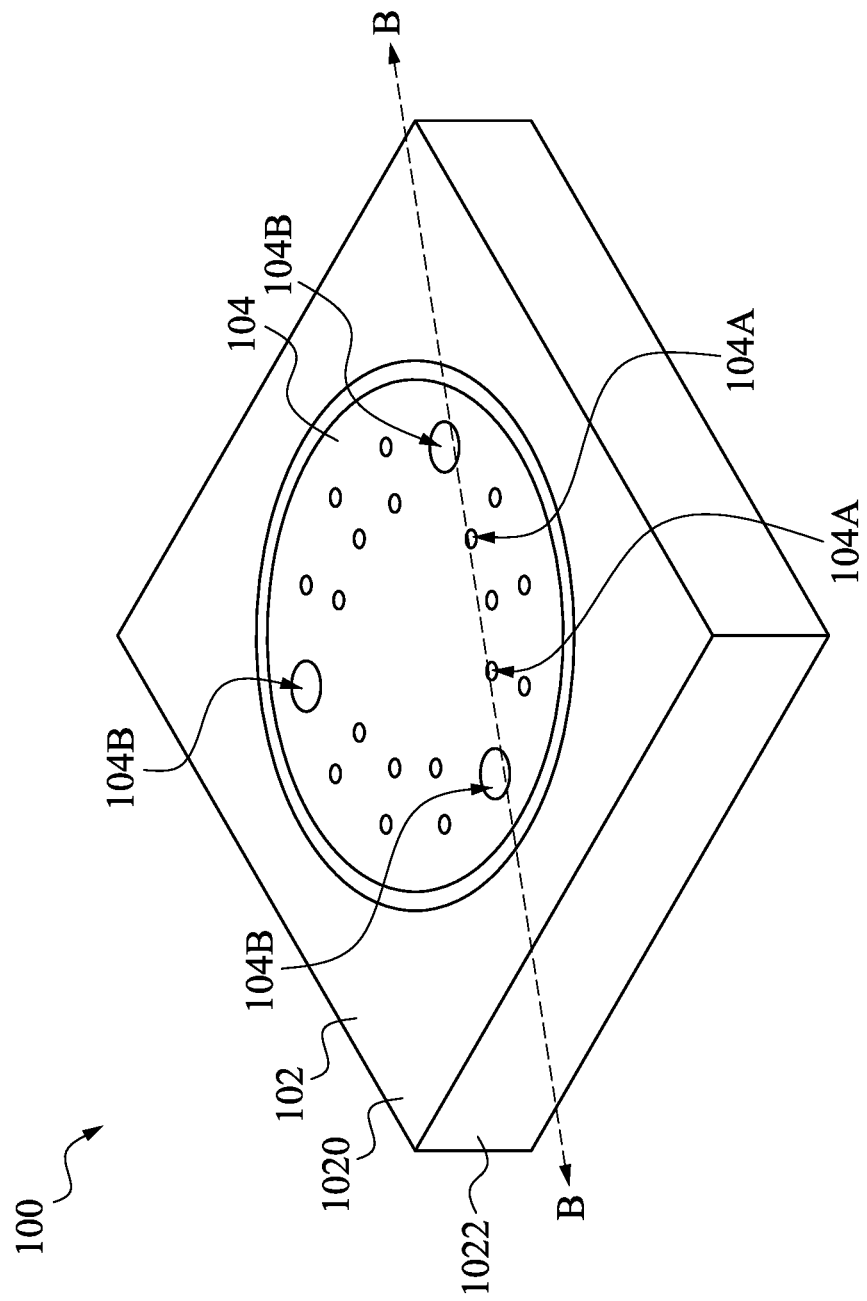
FIG. 1A is a perspective view of a wafer holding apparatus in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
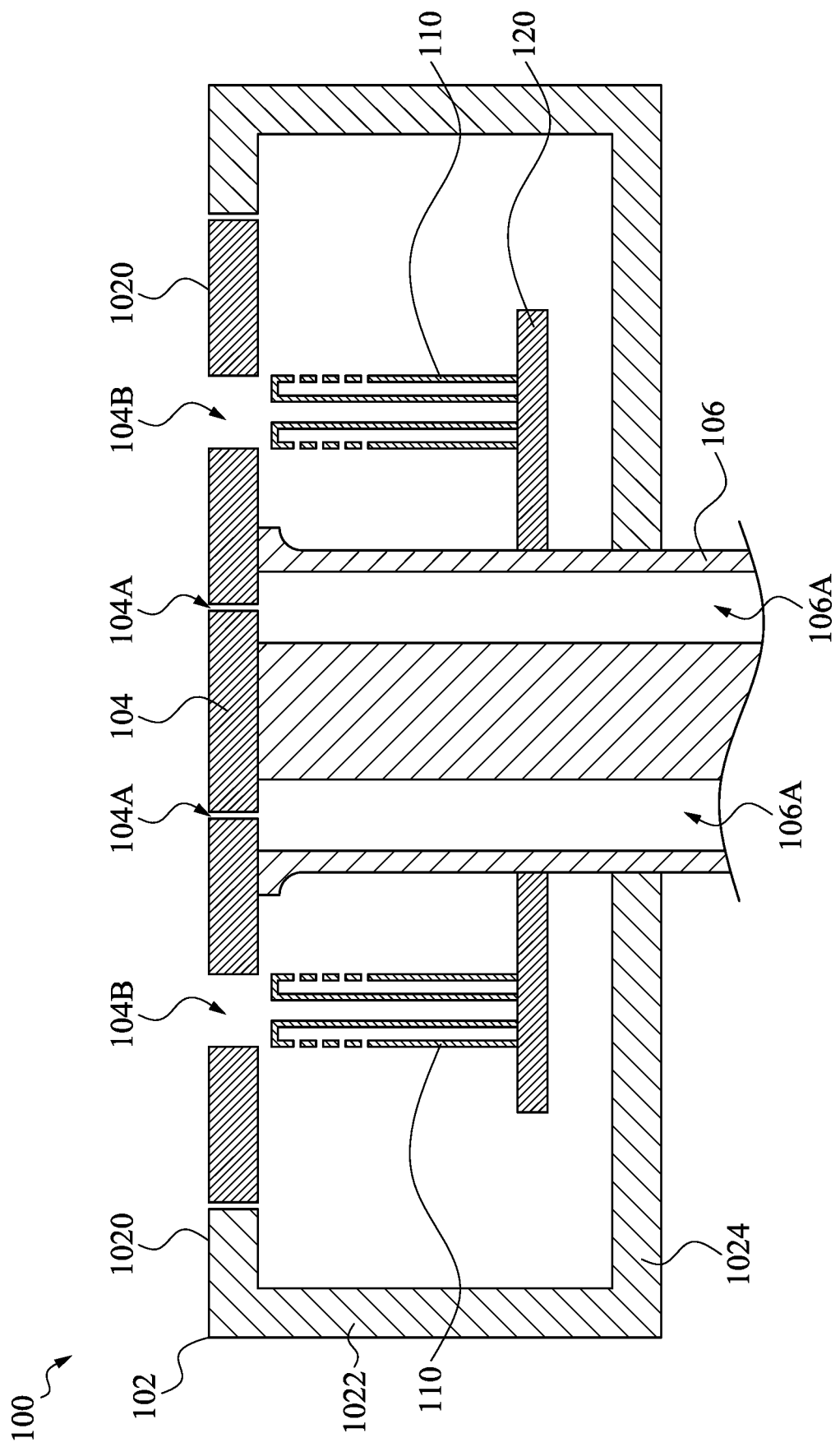
FIG. 1B is a cross-sectional view along line B-B of FIG. 1A.

FIG. 1A is a perspective view of a wafer holding apparatus in accordance with some embodiments of the present disclosure. FIG. 1B is a cross-sectional view along line B-B of FIG. 1A.

Shown there is a wafer holding apparatus 100. The wafer holding apparatus 100 includes a body 102. In some embodiments, the body 102 includes a top 1020, a plurality of sidewalls 1022, and a bottom 1024. The wafer holding apparatus 100 further includes a chuck 104. In some embodiments, the chuck 104 may be made of materials suitable to withstand processing conditions, such as aluminum nitride, aluminum oxide, stainless steel, aluminum, pyrolytic boron nitride, ceramic material, or the like. The body 102 and the chuck 104 collectively form an enclosed space. The chuck 104 may have a substantially planar support surface for supporting a wafer (not shown) thereupon. The chuck 104 may be coupled to a shaft 106. The shaft 106 may be at a level lower than the chuck 104 to allow the wafer (not shown) entering the wafer holding apparatus 100 to be placed on the chuck 104. The shaft 106 may support the chuck 104 during processing. In some embodiments, an RF electrode (not shown) may be provided within the chuck 104 to facilitate one or both of coupling RF power to the chamber or providing an RF ground path to remove RF power from the chamber.

The chuck 104 may include a plurality of chucking holes 104A. As shown in FIG. 1B, the chucking holes 104A vertically penetrates through the chuck 104, such that the regions above and below the chuck 104 are in gaseous communication. The chucking holes 104A may be formed in the chuck 104 via a suitable manner, such as during a molding, casting, or sintering process to form the chuck 104. In some embodiments of the present disclosure, the chucking holes 104A may be disposed surrounding the center of the chuck 104, as illustrated in FIG. 1A. For example, in the embodiments shown in FIG. 1A, the chucking holes 104A are arranged in concentric circles with respect to the center of the chuck 104. However, it is contemplated that other greater or fewer chucking holes 104A may be utilized in different locations within the chuck 104.

The shaft 106 may have a plurality of openings 106A (or other mechanism, such as tubes, holes, or the like) that gaseously couple the chucking holes 104A to a vacuum source (not shown). Accordingly, in operation, a wafer may be disposed on the support surface of the chuck 104 and retained thereon by application and maintenance of vacuum pressure via the chucking holes 104A.

The wafer holding apparatus 100 further includes a plurality of lifting pins 110, and the chuck 104 may include a plurality of lifting pin holes 104B that correspond to the lifting pins 110. As an example in FIGS. 1A and 1B, three lifting pin holes 104B are depicted with corresponding lifting pins 110 to facilitate raising and lowering the wafer (not shown) onto and off of the support surface of the chuck 104. Each of the chucking holes 104A has a first diameter and each of the lifting pin holes 104B has a second diameter. In some embodiments, the first diameter is smaller than the second diameter. Stated another way, the lifting pin holes 104B is larger than the chucking holes 104A.

In some embodiments, the number of the lifting pins 110 is the same as the number of the lifting pin holes 104B, and the lifting pins 110 correspond to the respective lifting pin holes 104B. The lifting pins 110 may be disposed on a lifting device 120 that is coupled to the shaft 106. Each of the lifting pin holes 104B has a size that permits the corresponding lifting pin 110 passes through. In some embodiments, the size of the lifting pin holes 104B is substantially the same as or slightly larger than the size of the lifting pins 110. As a result, when the wafer (not shown) is transferred to the wafer holding apparatus 100, the lifting device 120 may be actuated upward, such that the lifting pins 110 may be lifted up through the lifting pin holes 104B and over the chuck 104 to receive the wafer.

Figure 2C:
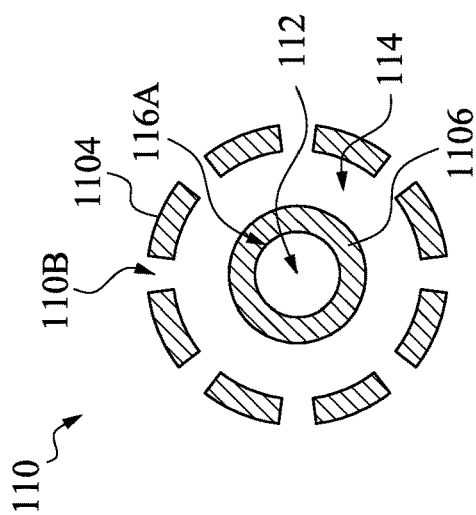
FIGS. 2B and 2C are a cross-sectional views of FIG. 2A.
Figure 2B:
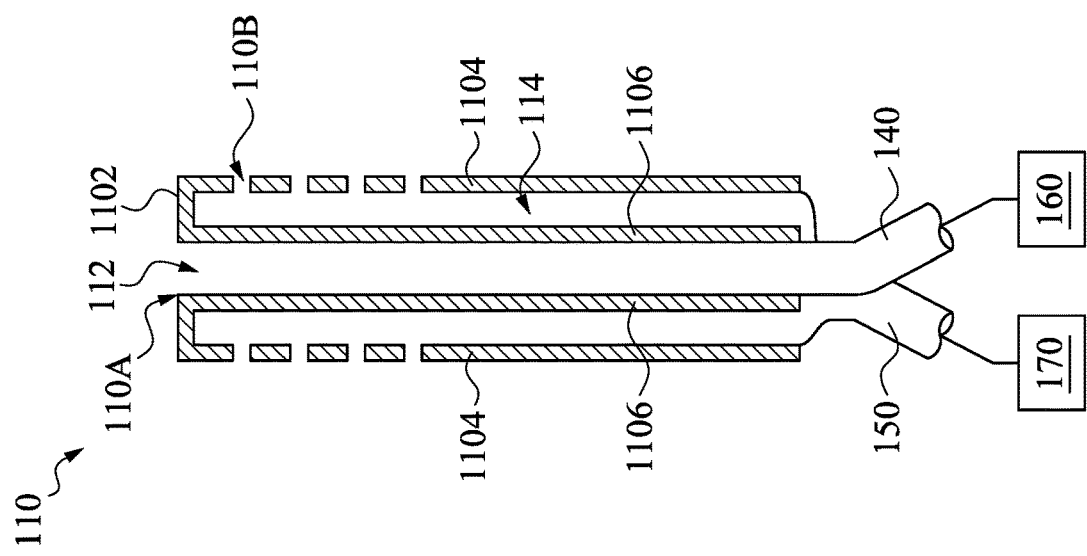
Figure 2A:
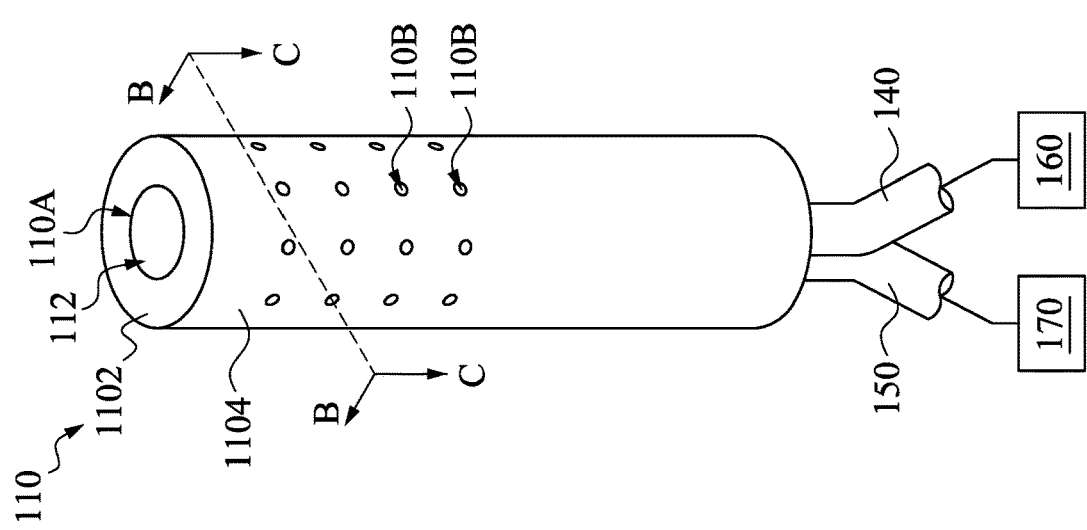
FIG. 2A is a perspective view of a lifting pin in accordance with some embodiments of the present disclosure.

FIG. 2A is a perspective view of the lifting pin 110 of the wafer holding apparatus 100 in FIGS. 1A and 1B. FIG. 2B is a cross-sectional view along line B-B of FIG. 2A, and FIG. 2C is a cross-sectional view along line C-C of FIG. 2A.

Shown in FIG. 2A is an enlarged view of the lifting pin 110 of the wafer holding apparatus 100 in FIGS. 1A and 1B. In embodiments represented in FIG. 2A, the lifting pin 110 is in a tubular shape. As shown in FIGS. 2B and 2C, the lifting pin 110 includes a top cap 1101, an inner tube wall 1105, and an outer tube wall 1103. The outer tube wall 1103 surrounds the inner tube wall 1105, and the top cap 1101 is disposed over the inner and outer tube walls 1105 and 1103. In some embodiments, the inner tube wall 1105 defines an inner gas passage 112 therein, and the inner tube wall 1105 and the outer tube wall 1103 define an outer gas passage 114 therebetween. The top cap 1101 has an opening 110A is gaseous communicated with the inner gas passage 112. In some embodiments, one end of the inner gas passage 112 is exposed at the opening 110A on the top cap 1101 of the lifting pin 110, and the top of the outer gas passage 114 is covered by the top cap 1101. The outer tube wall 1103 has a plurality of openings 110B in gaseous communicated with the outer gas passage 114. That is, the outer gas passage 114 is exposed at the openings 110B of the outer tube wall 1103. In some embodiments, the inner gas passage 112 and the outer gas passage 114 are concentrically arranged, and the outer gas passage 114 is disposed around the inner gas passage 112. In some embodiments, the inner gas passage 112 and the outer gas passage 114 are gaseously isolated from each other. Therefore, gas in the inner gas passage 112 would not flow in to the outer gas passage 114, and vice versa.

In some embodiments, the openings 110B are vertically arranged along the lengthwise direction (i.g., axial direction) of the lifting pin 110. On the other hand, the openings 110B are circumferentially arranged with respect to the lengthwise axis of the lifting pin 110. In some embodiments, the vertical pitches between two adjacent openings 110B are substantially the same, while the present disclosure is not limited thereto. The "vertical pitch" is a distance between two adjacent openings 110B along the axial direction of the lifting pin 110. In some embodiments, the horizontal pitches between two adjacent openings 110B are substantially the same, while the present disclosure is not limited thereto. The "horizontal pitch" is a distance between two adjacent openings 110B along a circumferential direction of the lifting pin 110 that is perpendicular to the axial direction of the lifting pin 110. In some embodiments, the openings 110B are arranged in columns and rows along the sidewall 1103 of the lifting pin 110.

The inner gas passage 112 is connected to a first pipe 140, and the outer gas passage 114 is connected to a second pipe 150 that is gaseously isolated from the first pipe 140. In some embodiments, the inner gas passage 112 is airtightly connected with the first pipe 140 to prevent gas leakage. Similarly, the outer gas passage 114 is airtightly connected with the second pipe 150. In some embodiments, the first pipe 140 and the second pipe 150 may be may be suitable material, such as rubber, or the like.

In some embodiments, one end of the first pipe 140 is connected to the first tube 112, and the other end of the first pipe 140 is connected to a vacuum source 160, so that the vacuum source 160 can draw gas from the inner gas passage 112 via the first pipe 140, which in turn will provide a vacuum suction force to a region above the lifting pin 110. Further, in some embodiments, one end of the second pipe 150 is connected to the outer gas passage 114, and the other end of the second pipe 150 is connected to a gas source 170, so as to introduce another gas into the outer gas passage 114 via the second pipe 150. In this way, gas from the gas source 170 can be discharged out of the lifting pin 110 through the openings 110B on the outer tube wall 1103. Detail descriptions will be discussed later. In some embodiments, the vacuum source 160 may include a vacuum pump, or the like.

As mentioned above, when a wafer is to be mounted onto the wafer holding apparatus 100, the lifting pins 110 may be raised up through the lifting pin holes 104B in the chuck 104 to receive the wafer. Then, the wafer may be initially disposed onto the lifting pins 110. In greater detail, the wafer may be disposed on the top cap 1101 of the lifting pins 110 where the first tube 112 is disposed thereon. Meanwhile, the vacuum source 160 connected to the first tube 112 is actuated, so as to remove a gas from the first tube 112 through the first pipe 140 and to provide a suction force to hold the wafer on the lifting pins 110 by vacuum pressure.

Since the lifting pins 110 are raised up above the chuck 104, the openings 110B of the lifting pins 110 are accordingly raised up above the chuck 104. In some embodiments, the gas source 170 is actuated to supply a gas into the second tube 114 via the second pipe 150, and therefore the gas may be ejected out of the lifting pins 110 through the openings 110B. As a result, in some embodiments of the present disclosure, before the wafer is moved back to the chuck 104, the lifting pins 104 may be controlled to blow gas across a top surface of the chuck 104, so as to clean the chuck 104 by removing particles over the chuck 104. Accordingly, when the wafer is lowered to be in contact with (or in close proximity to) the cleaned chuck 104 that is substantially free from particles, the wafer may be flatly disposed on the chuck 104, and thus the process performance in later steps may be improved. More details will be discussed later.

Figure 3:
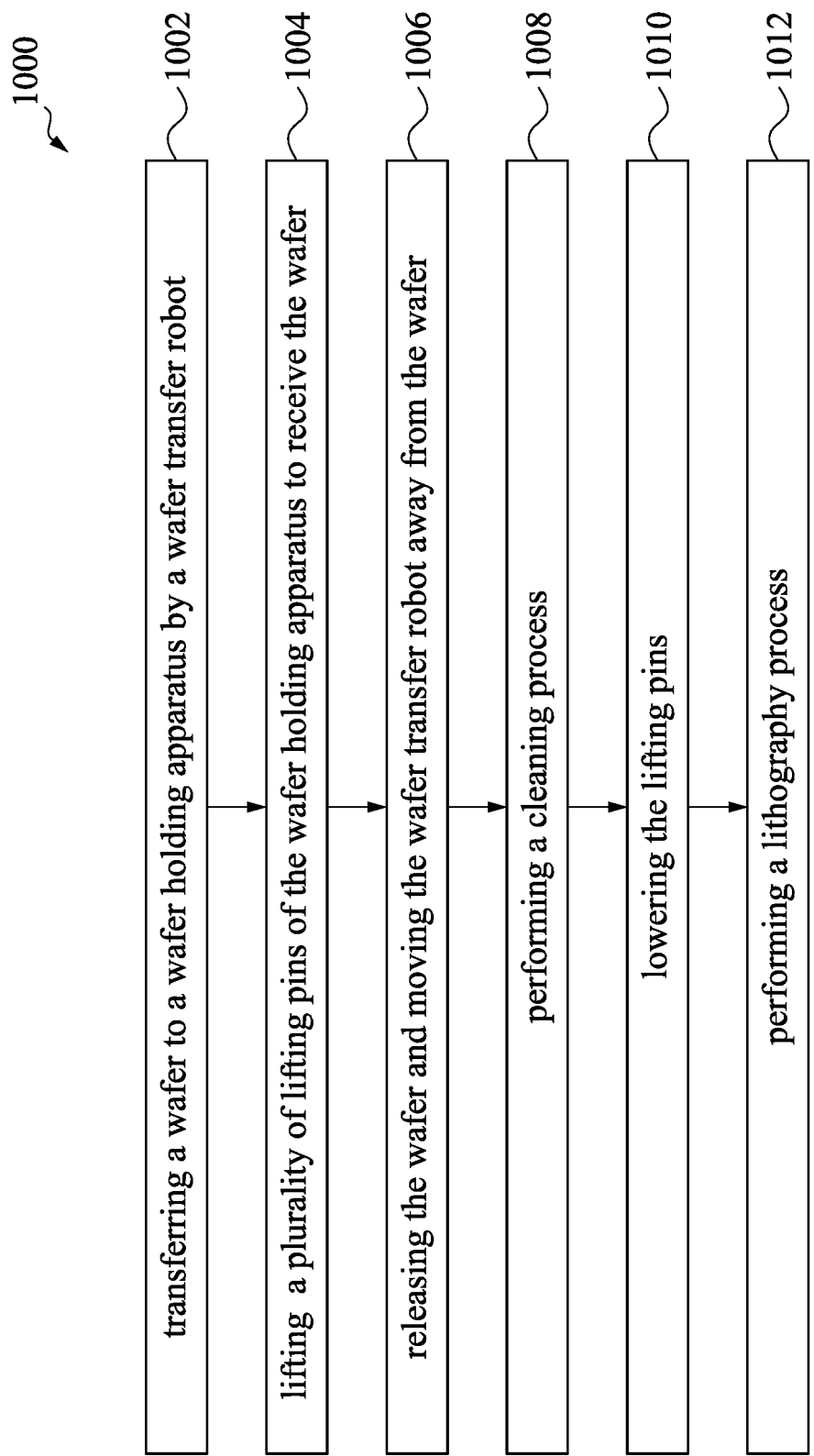
FIG. 3 is a method for operating a wafer holding apparatus in accordance with some embodiments of the present disclosure.

FIG. 3 is a method for operating a wafer holding apparatus in accordance with some embodiments of the present disclosure. FIGS. 4A to 4G are wafer holding apparatus at various stages of operation in accordance with some embodiments of the present disclosure.

Figure 4A:
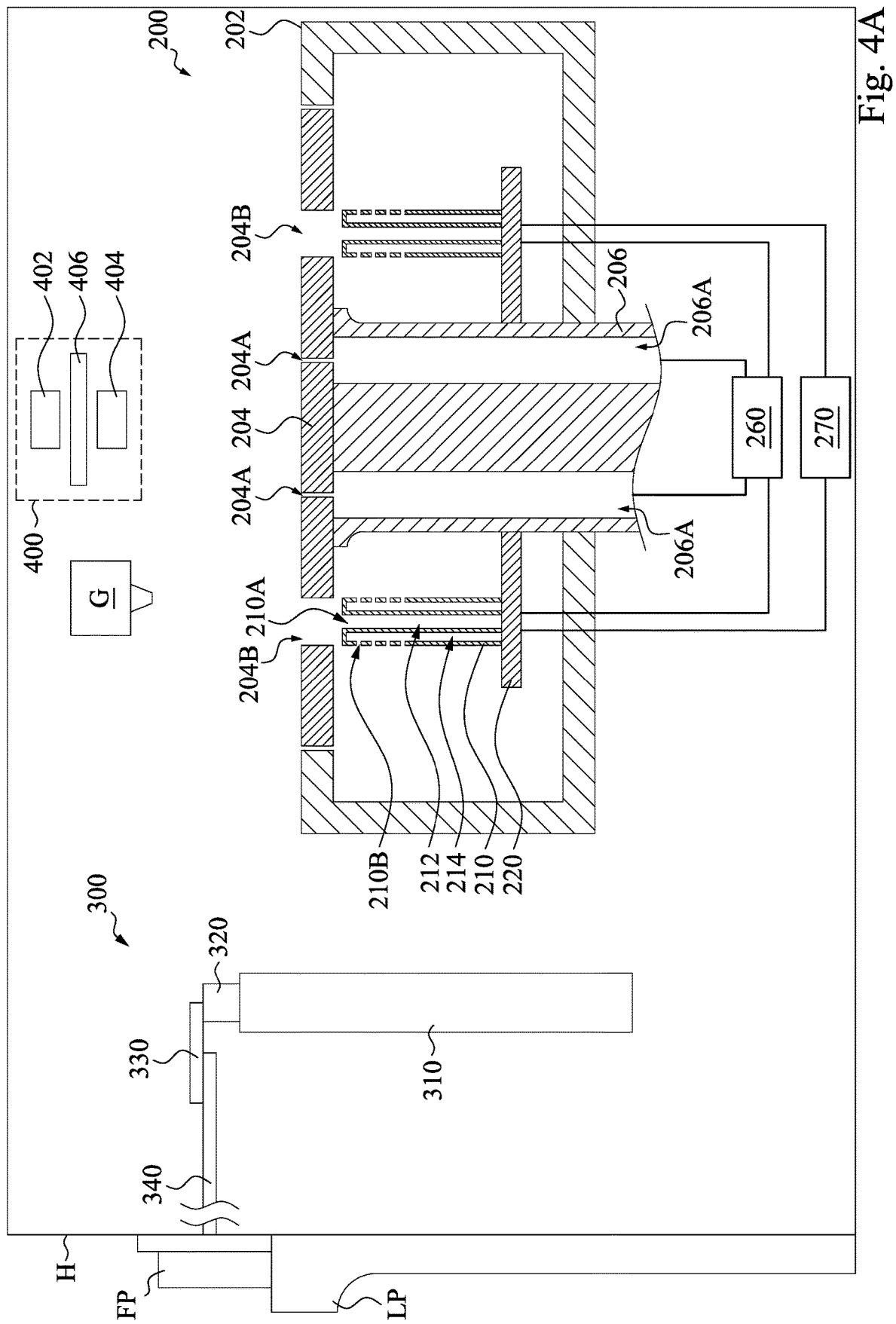
FIGS. 4A to 4G are wafer holding apparatus at various stages of operation in accordance with some embodiments of the present disclosure.

Referring is made to FIG. 4A, shown there is a wafer holding apparatus 200, a wafer transfer robot 300, an exposure tool 400, a load port LP, and a purging-gas-supply device G. The wafer holding apparatus 200, the wafer transfer robot 300, and the exposure tool 400 may be electrically connected, and may be operated to carry out the method of FIG. 3. In some embodiments, the wafer holding apparatus 200, the wafer transfer robot 300, and the exposure tool 400 may be collectively referred as a lithography system.

In some embodiments, the wafer holding apparatus 200, the exposure tool 400, and the purging-gas-supply device G are disposed in a housing H, which provides a sealed, contained system for components thereof in some embodiments, for example. A load port LP is coupled to the housing H, which allows for moving a wafer from a front opening unified pod (FOUP) FP into the housing H.

The wafer holding apparatus 200 includes a body 202 and a chuck 204. The chuck 204 may have a substantially planar support surface for supporting a wafer (e.g., wafer W in FIG. 4B) thereupon. The chuck 204 may be coupled to a shaft 206, which can support the chuck 204 during processing.

The chuck 204 may include a plurality of chucking holes 204A. The chucking holes 204A vertically penetrates through the chuck 204, such that the regions above and below the chuck 204 are in gaseous communication. The shaft 206 may have a plurality of openings 206A (or other mechanism, such as tubes, holes, or the like) that gaseously couple the chucking holes 204A to a vacuum source 260. Accordingly, in operation, a wafer may be disposed on the support surface of the chuck 204 and retained thereon by application and maintenance of vacuum pressure via the chucking holes 204A.

Figure 4B:
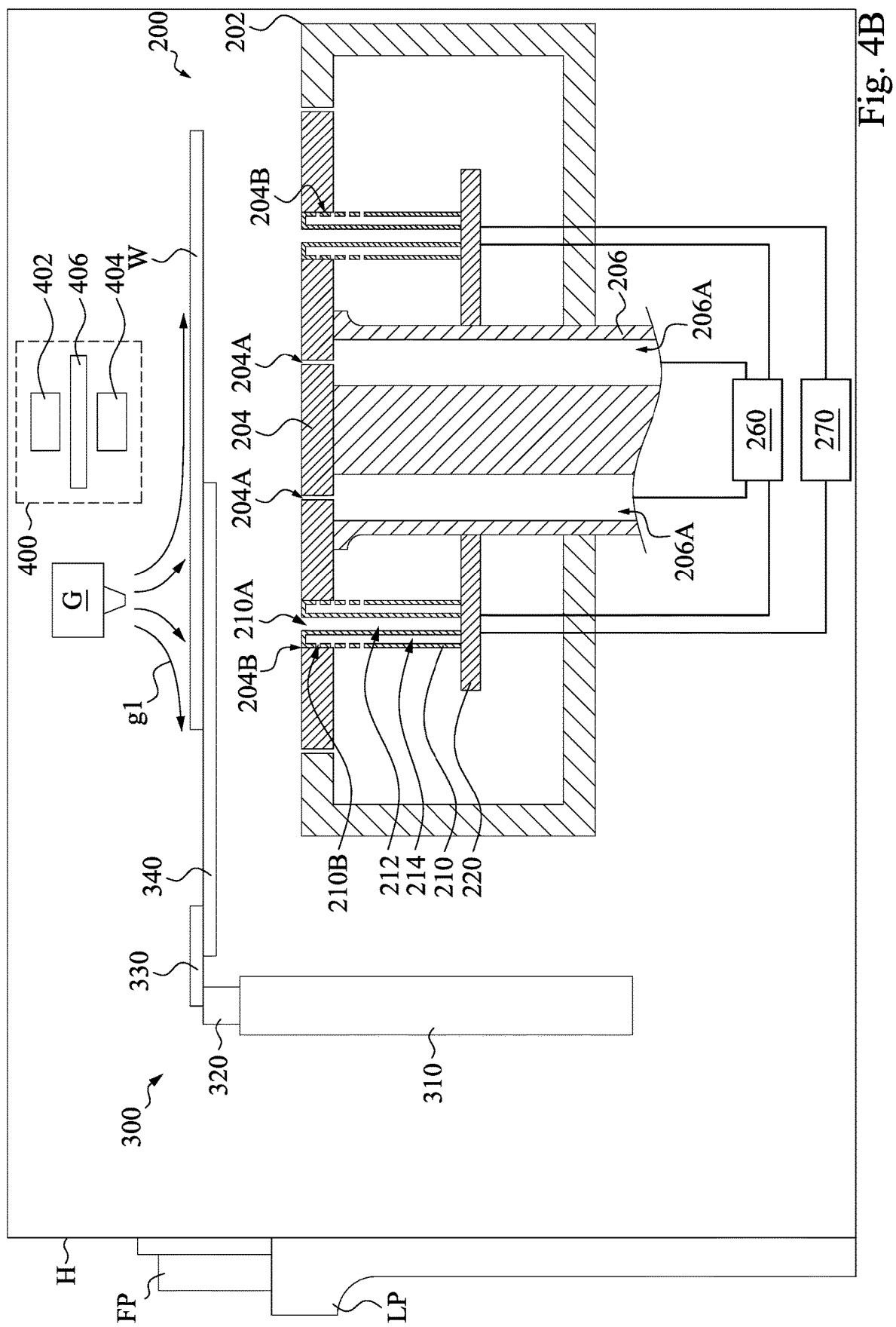

The chuck 204 may include a plurality of lifting pin holes 204B to facilitate raising and lowering the wafer (e.g., wafer W in FIG. 4B). As described above, the wafer holding apparatus 200 includes a plurality of lifting pins 210, in which each of the lifting pins 210 corresponds respectively to each of the lifting pin holes 204B of the chuck 204.

Similar to those described in FIGS. 2A to 2C, at least one of the lifting pins 210 defines an inner gas passage 212 and an outer gas passage 214 therein where the outer gas passage 214 surrounds the inner gas passage 212. One end of the inner gas passage 212 is exposed from the opening 210A of the lifting pin 210, and the other end of the inner gas passage 212 is connected to the vacuum source 260, so as to provide a vacuum suction force to a region above the lifting pin 210. On the other hand, the outer gas passage 214 is exposed from the outer tube wall of the lifting pin 210 through the openings 210B, and the outer gas passage 214 connected to the gas source 270, such that gas from the gas source 270 can be ejected out of the lifting pin 210 through the openings 210B. In some embodiments, the gas from the gas source 270 may include inert gas, hydrogen ($H_2$), nitrogen ($N_2$), oxygen ($O_2$), nitrogen trifluoride ($NF_3$) or other suitable gases. In some embodiments, the inert gas is, for example, argon (Ar), helium (He) or the like.

The wafer transfer robot 300 is disposed adjacent to the wafer holding apparatus 200. In some embodiments, the wafer transfer robot 300 includes a support 310. On top of the support 310, a robot drive 320 is provided that controls an armset including an arm 330. As illustrated in FIG. 4A, one arm 330 is mounted on the robot drive 320. In some other embodiments, suitable number of arms may be employed, such as two or more. The robot drive 320 and the arm 330 are rotatably connected to each other. At the far end of the arm 330, a gripper 340 is rotatably connected thereto.

The wafer transfer robot 300 can position the gripper 340 in a desired position within a circle around the support 310, having a radius that is substantially determined by the length of the arm 330. As is apparent, also other kinds of robots may be used. The gripper 340 is arranged to clamp an object, such as a wafer. Clamping can be done in several ways, for instance, the gripper 340 can use a low pressure clamp to fix a wafer to the gripper 340. Alternative embodiments could use a clamp based on friction or a can use electromagnetic forces to clamp the wafer. In the beginning, the gripper 340 of the wafer transfer robot 300 may pick up a wafer (e.g., the wafer W in FIG. 4B) from the FOUP FP on the load port LP, which can be equivalently referred to as a load-station for loading and unloading wafers.

The exposure tool 400 is disposed over the chuck 204 of the wafer holding apparatus 200. In some embodiments, the exposure tool 400 is designed for performing a lithography exposure process to a resist layer coated on a wafer (e.g., the wafer W in FIG. 4B). In some embodiments of FIG. 4A, the exposure tool 400 includes a radiation source 402 to provide radiation energy, and an optical module 404 that modulates the radiation energy by the image of a mask 406 and directs the modulated radiation energy to the resist layer coated on the wafer.

The radiation source 402 may be any radiation source suitable for exposing a resist layer. In various examples, the radiation source 402 may include a light source selected from the group consisting of ultraviolet (UV) source, deep UV (DUV) source, extreme UV (EUV) source, and X-ray source. For example, the radiation source 402 may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; or other light sources having a desired wavelength (e.g., below approximately 100 nm). In another example, the light source is a EUV source having a wavelength of about 13.5 nm or less. In an alternative embodiment, the radiation source 402 is an electron beam (e-beam) source for exposing a resist layer by a proper mode, such as direct writing. In such a case, the mask 406 is not used during the exposing processes.

The optical module 404 may be designed to have a refractive mechanism or reflective mechanism. In a refractive mechanism, the optical module 404 includes various refractive components, such as lenses. In a reflective mechanism, the optical module 404 includes various reflective components, such as mirrors.

In an embodiment, the mask 406 includes a transparent substrate and a patterned absorption layer. The transparent substrate may use fused silica ($SiO_2$) relatively free of defects, such as borosilicate glass and soda-lime glass. The absorption layer may include a metal film such as chromium (Cr) for absorbing light directed thereon. The absorption layer is further patterned to have one or more openings in the metal film through which a light beam may travel without being completely absorbed. In another embodiment where the radiation source 402 generates EUV radiation, the mask 406 is designed to have reflective mechanism. For example, the mask 406 may include a substrate coated with tens of alternating layers of silicon and molybdenum to act as a Bragg reflector that maximizes the reflection of EUV light.

Reference is made to FIGS. 3 and 4B, the method 1000 begins at operation 1002 where a wafer is transferred to a wafer holding apparatus by a wafer transfer robot. As illustrated, a wafer W is transferred to a position over the chuck 204 of the wafer holding apparatus 200 via the wafer transfer robot 300. In the beginning, the gripper 340 of the wafer transfer robot 300 may pick up the wafer W from a FOUP FP on a load port LP (see FIG. 4A). Then, the wafer transfer robot 300 is moved, such as by rotating, toward the wafer holding apparatus 200 to place the wafer W over the chuck 204. In greater detail, the support 310, the robot drive 320, and the arm 330 of the wafer transfer robot 300 may be collectively operated to hang the wafer W over the chuck 204 of the wafer holding apparatus 200 in a desired positon.

In some embodiments, after the wafer W is moved to a desired position, a purging device G may start to eject purging gas g1 downward to the wafer W, so as to blow contaminants (e.g., particles) away from the top surface of the wafer W. In some embodiments, the purging device G may continuously eject purging gas g1 during the following operations as shown in FIGS. 4C-4G, so as to prevent contaminants from landing on the top surface of the wafer W during the following operations as shown in FIGS. 4C-4G. In some embodiments, the purging gas g1 includes inert gas, hydrogen ($H_2$), nitrogen ($N_2$), oxygen ($O_2$), nitrogen trifluoride ($NF_3$) or other suitable gases. In some embodiments, the inert gas is argon (Ar) or helium (He).

Figure 4C:
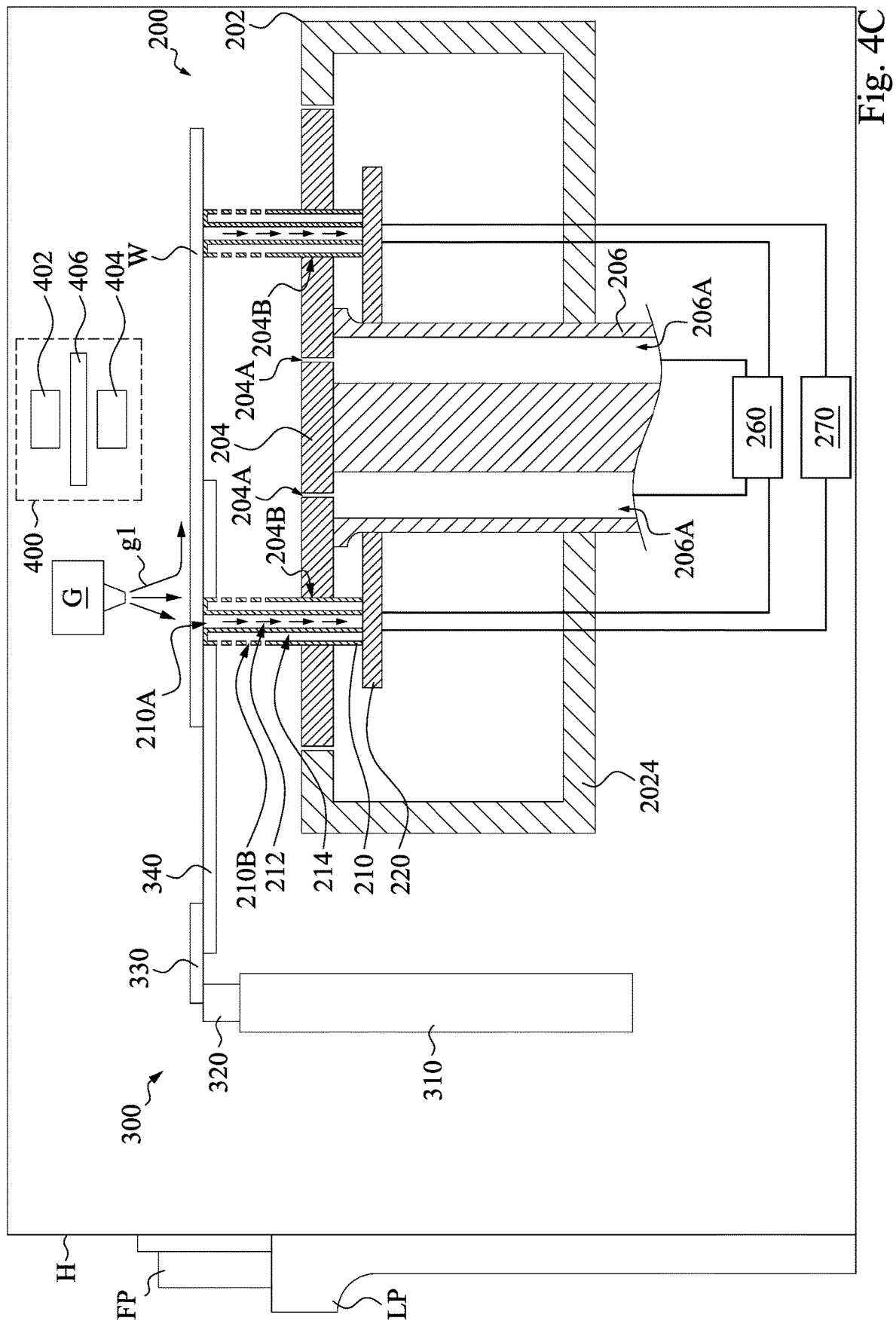

Reference is made to FIGS. 3 and 4C, the method 1000 proceeds to operation 1004 where a plurality of lifting pins of the wafer holding apparatus are lifted to receive the wafer. As illustrated, after the wafer W is transferred to a desired position, the lifting pins 210 of the wafer holding apparatus 200 are lifted to receive the wafer W, such that the top surfaces of the lifting pins 210 attach the bottom surface of the wafer W to support the wafer W. In greater detail, the lifting device 220 is actuated upward, such that the lifting pins 210 are lifted up through the lifting pin holes 204B and above the chuck 204 to receive the wafer W.

After the lifting pins 210 attach the wafer W, the top end of the inner gas passage 212 of the lifting pins 210 are substantially connected to the bottom surface of the wafer W. Then, the vacuum source 260 may be actuated to evacuate gas from the inner gas passage 212 through the inner gas passage 212, thereby holding or securing the wafer W to the lifting pins 210 via vacuum suction force. In this way, the wafer W may be stably disposed on the lifting pins 210 via vacuum pressure. As such, the wafer W would not be moved during the following operations.

Figure 4D:
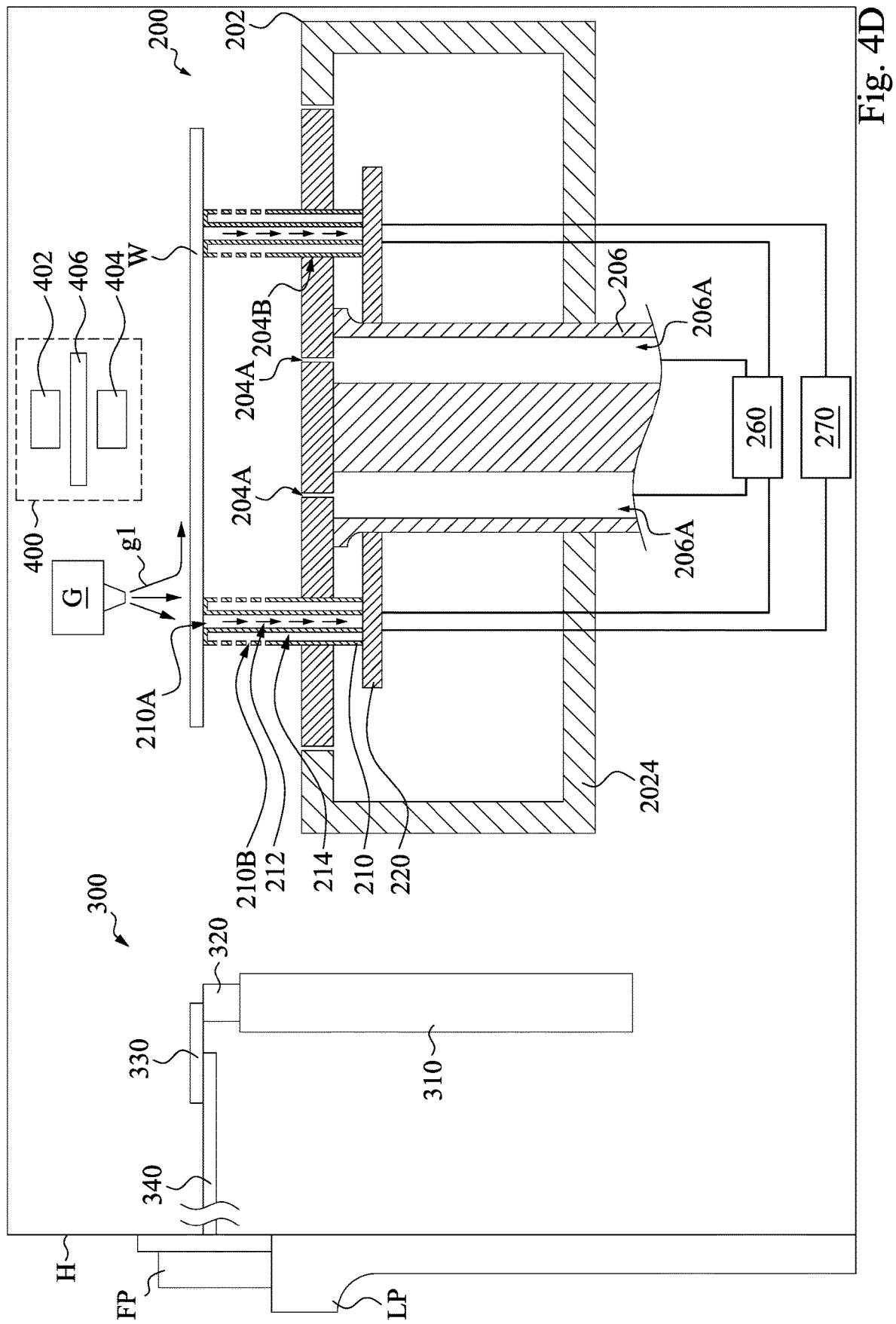

Reference is made to FIGS. 3 and 4D, the method 1000 proceeds to operation 1006 where the wafer transfer robot 300 releases the wafer and is then moved away from the wafer. As illustrated, the gripper 340 of the wafer transfer robot 300 stops gripping the wafer W and is then moved away from the top of the chuck 204 of the wafer holding apparatus 200. In some embodiments, because the wafer W is stably secured on the lifting pins 210 via vacuum pressure, the wafer W would not be affected during removing the gripper 340.

Figure 4E:
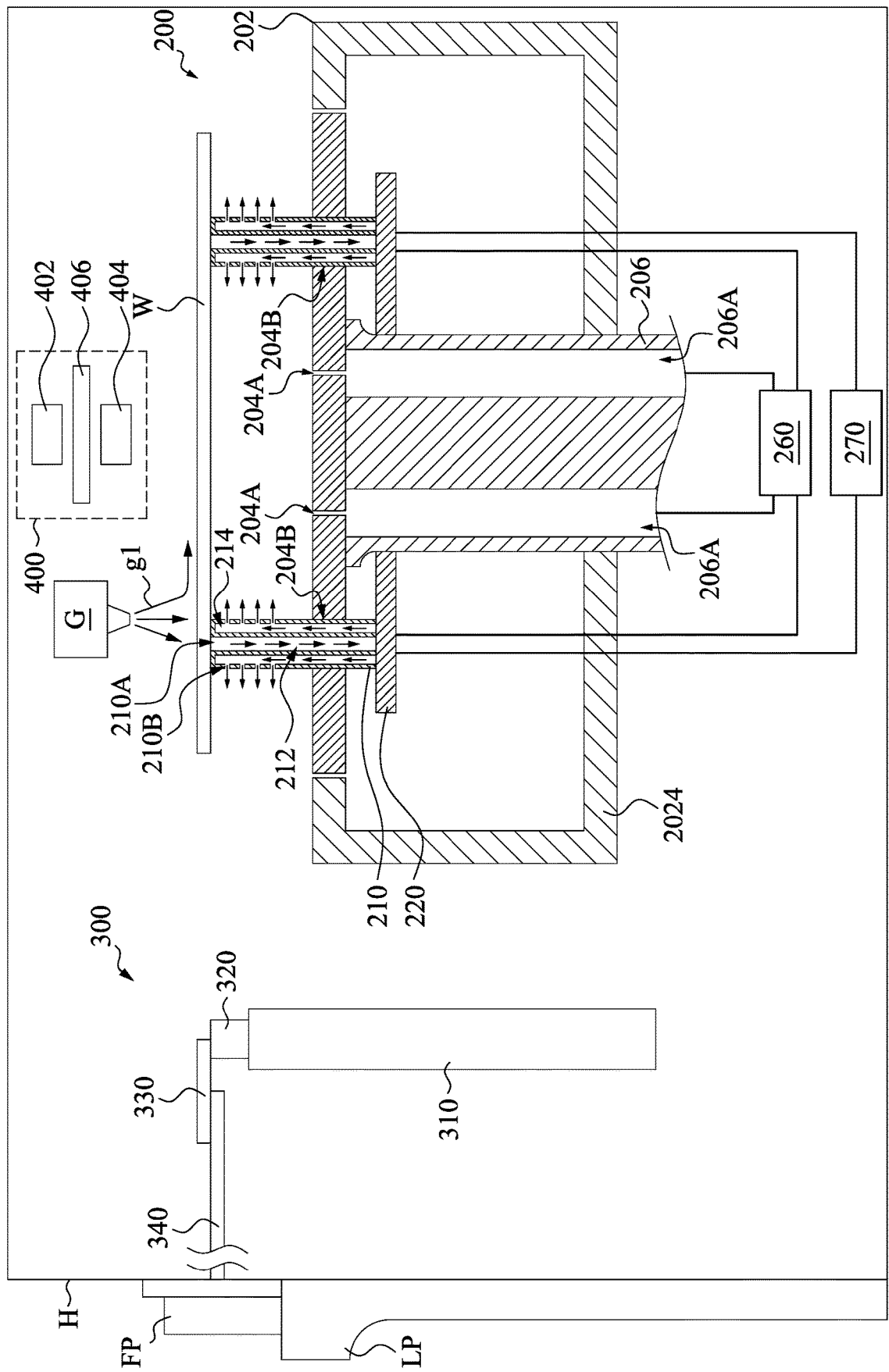

Reference is made to FIGS. 3 and 4E, the method 1000 proceeds to operation 1008 where a cleaning process is performed. In some embodiments of the present disclosure, a cleaning process is performed by introducing gas into the region between the chuck 204 and the wafer W. As mentioned above, each of the outer gas passage 214 of the lifting pins 210 is gaseously communicated with the openings 210B on the lifting pin 210. Also, the outer gas passage 214 of the lifting pins 210 are connected to the gas source 270. As such, after the gripper 340 of the wafer transfer robot 300 is removed from the top of the chuck 340, the gas source 340 may be actuated to provide gas into the outer gas passage 214 of the lifting pins 210. As the gas exits in the outer gas passage 214, it is discharged out of the lifting pins 210 through the openings 210B of the lifting pins 210, and then flows along the region between the chuck 204 and the backside of the wafer W.

It is noted that because the openings 210B are present on the sidewalls of the lifting pins 210, the gas is laterally ejected out of the lifting pins 210. As the gas flows between the chuck 204 and the backside of the wafer W, the gas flow causes the particles lying on the surface of the chuck 204, such as dust particles, to be repelled away from the surface of the chuck 204, at which point they are swept away by the gas. As a result, the surface of the chuck 204 is cleaned by reducing the amounts of the particles on the chuck 204. In some embodiments, as similar to those described in FIGS. 2A to 2C, the openings 210B may circumferentially arranged on the sidewalls of the lifting pins 210, and thus the gas may be circumferentially ejected out of the lifting pins 210, accordingly. This causes the gas to be substantially spread over the whole surface of the chuck 204, which in turn will facilitate the cleaning process.

In greater details, the gas is pumped by the gas source 270 at a pressure sufficient enough to dislodge the particles lying on the chuck 204, yet not strong enough to push the wafer W off of the lifting pins 210 or to move the wafer W during the cleaning process. In some embodiments, during the cleaning process, the vacuum source 260 may be continuously operated, so as to further hold the wafer W on the lifting pins 210 via vacuum pressure. As such, the wafer W can be further prevented from moving by the gas flow.

In some embodiments, various types of gases may be pumped by the gas source 270 into the outer gas passage 214 of the lifting pins 210. For example, hydrogen gas may be pumped towards the backside of the wafer W. Other suitable gas with desired properties, such as argon (Ar), helium (He), nitrogen ($N_2$), oxygen (02) may also be used in accordance with principles described herein.

As discussed above, during the lifting pins 210 laterally eject gas through the openings 210B, the purging-gas-supply device G may continuously provide gas flow g1 over the wafer W, and thus the particles resulting from the cleaning process of FIG. 4E (e.g., the gas ejected from the lifting pins 210) would not land on the top surface of the wafer W and would not cause contamination to the top surface of the wafer W.

Figure 4F:
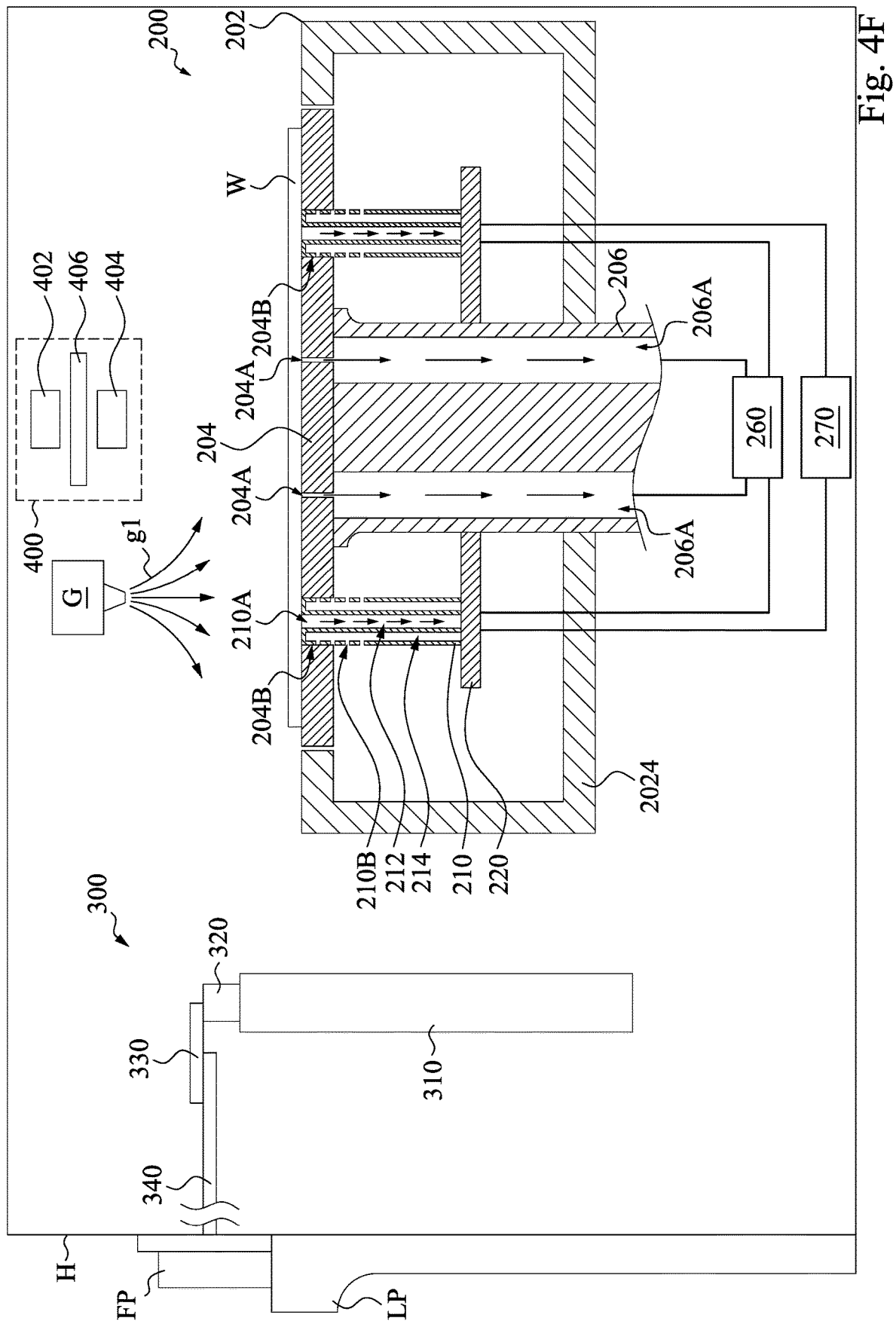

Reference is made to FIGS. 3 and 4F, the method 1000 proceeds to operation 1010 where the lifting pins are lowered. As illustrated, the lifting pins 210 of the wafer holding apparatus 200 are lowered, such that the wafer W is lowered and brought in contact with the top surface of the chuck 204. In greater detail, the lifting pins 210 are lowered through the lifting pin holes 204B in the chuck 204 by actuating the lifting device 220 downward, such that the lifting pins 210 are moved downwardly passing through the lifting pin holes 204B.

The lifting pins 210 are lowered until the wafer W is in contact with the top surface of the chuck 204. In some other embodiments, during lowering the wafer W, the gas source 270 may be operated to continuously provide gas into the lifting pins 210 until the wafer W is attached to the chuck 204, so as to continuously repel particles on the chuck 204. Stated another way, the cleaning process in operation 1008 is performed until the wafer W is in contact with the chuck 204, which ensures the interface between the wafer W and the chuck 204 is substantially free from particles. Thus, before performing the following process (such as the lithography process in FIG. 4G), the cleaning process is halted. That is, the gas source 270 is stopped providing gas into the lifting pins 210 before performing the following process. In some embodiments, stopping or halting the gas source 270 includes turning off an on/off valve that controls the gas source 270.

In some embodiments, after the wafer W is in contact with the chuck 204, the vacuum source 260 may be actuated to evacuate a gas from the chucking holes 204A of the chuck and the openings 206A in the shaft 206, thereby holding the wafer W to the chuck 204 via vacuum suction force. In this way, the wafer W may be stably disposed on the chuck 204 via vacuum pressure. As such, the wafer W would not be moved during the following operations.

Figure 4G:
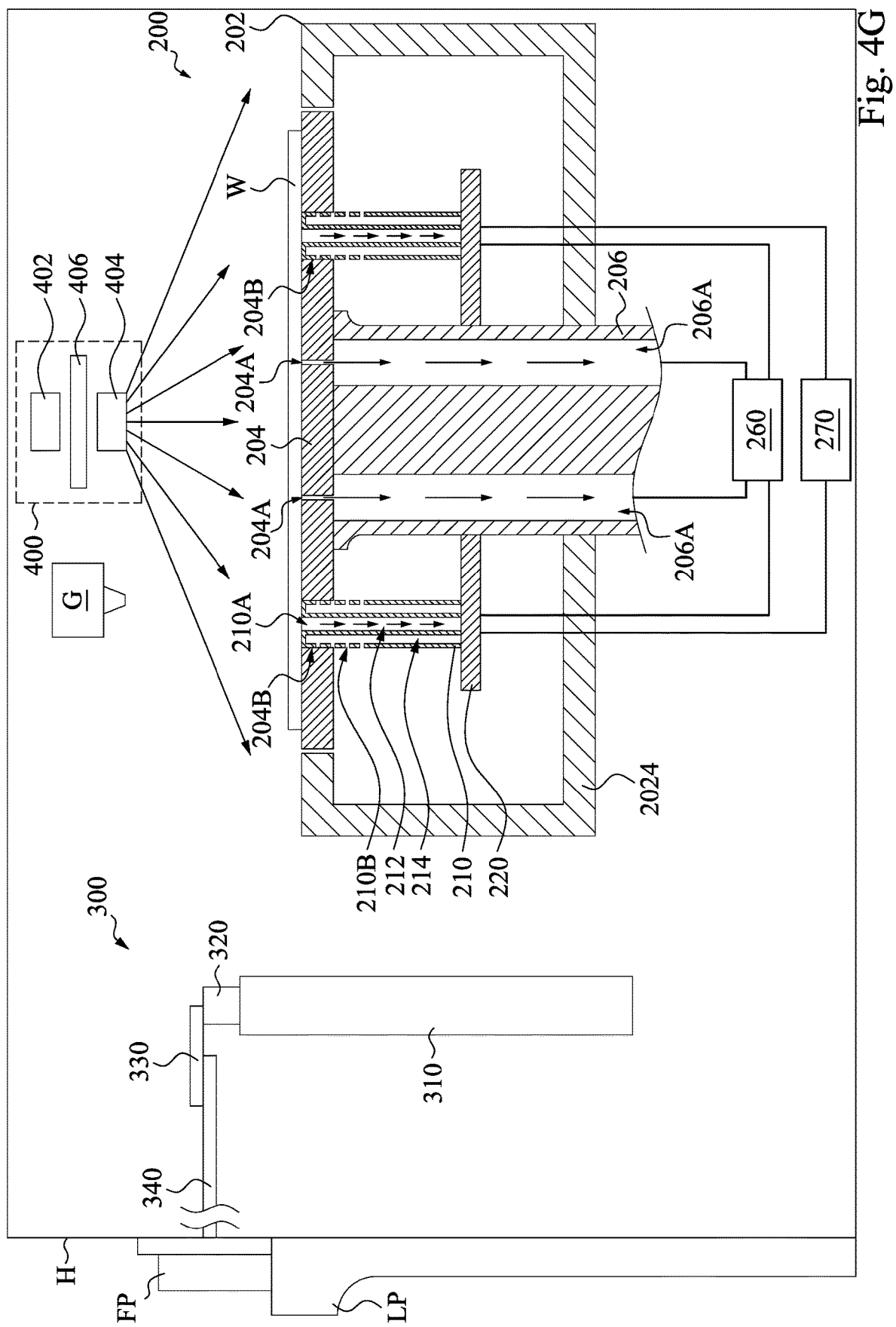

Reference is made to FIGS. 3 and 4G, the method 1000 proceeds to operation 1012 where a lithography process is performed. After the wafer W is secured to the top surface of the chuck 204 by suction, a lithography process is performed by operating the exposure tool 400 for exposing a resist layer coated on the wafer W. When the exposed resist layer is further developed, various openings are formed in the resist layer, resulting in a patterned resist layer. The patterned resist layer is subsequently used for etching the wafer W in order to form a material layer with designed IC patterns on the wafer W, thereby forming features therein or thereon for an integrated circuit. This process may be repeated, layer by layer, for forming multiple material layers on the wafer W.

As mentioned above, a cleaning process is performed prior to performing the lithography process, such that particles on the chuck 204 may be repelled. Accordingly, the interface between the wafer W and the top surface of the chuck 204 is substantially free from particles, such that the wafer W can be uniformly attached to the chuck 204. If some particles are present at the interface between the wafer W and the chuck 204, the particles may lead to deformation of the wafer W and thus poor photolithographic overlay control. Because particles are blown away from the wafer as illustrated in FIG. 4E according to some embodiments of the present disclosure, contamination to the wafer W due to the particles can be reduced, which in turn will result in improved photolithographic overlay control.

Figure 5:
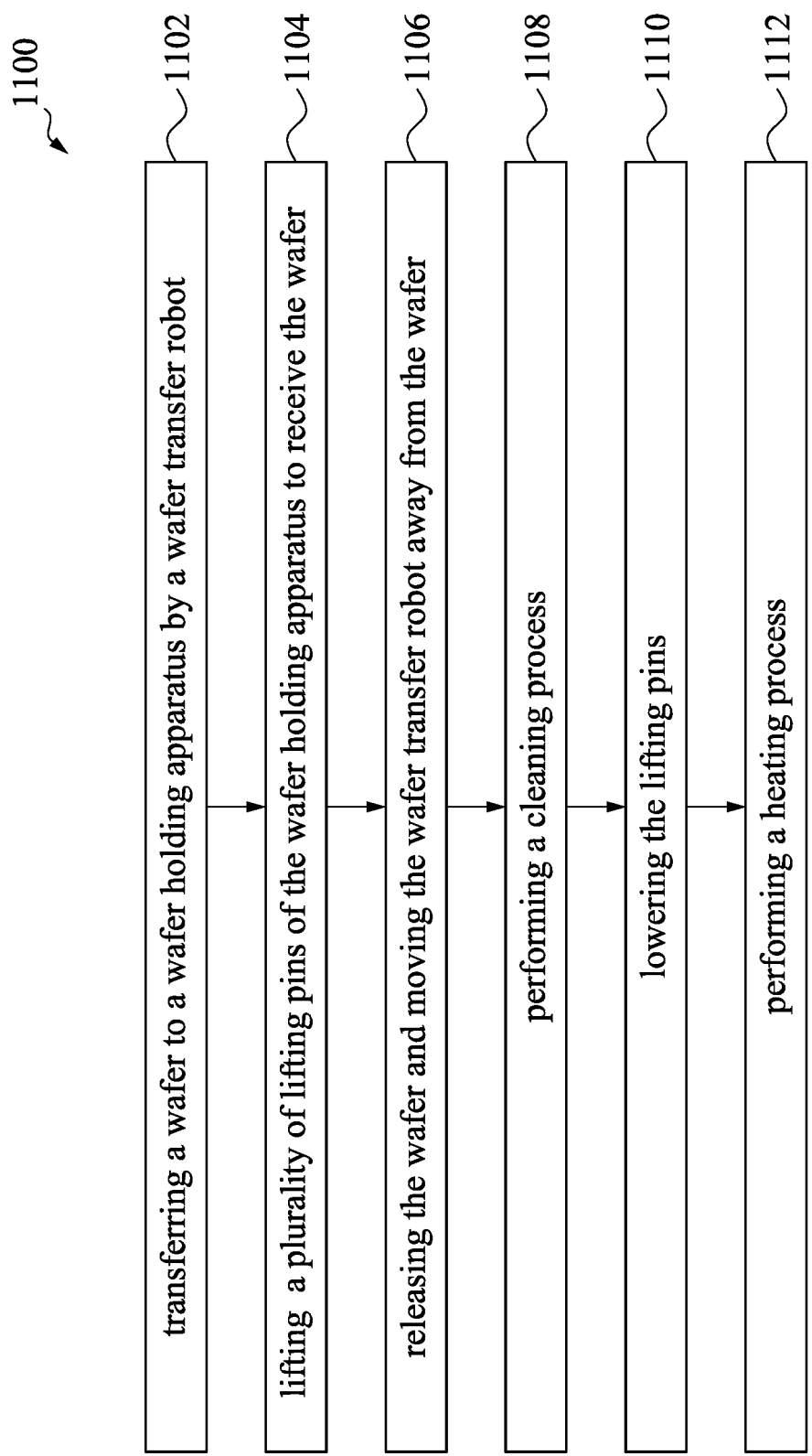
FIG. 5 is a method for operating a wafer holding apparatus in accordance with some embodiments of the present disclosure.

FIG. 5 is a method 1100 for operating a wafer holding apparatus in accordance with some embodiments of the present disclosure. FIGS. 6A to 6G are wafer holding apparatus at various stages of operation in accordance with some embodiments of the present disclosure.

Referring is made to FIG. 6A, shown there is a wafer holding apparatus 200, a wafer transfer robot 300, and a heating tool 500. The wafer holding apparatus 200 and the wafer transfer robot 300 is similar to those described in FIGS. 4A to 4G, and thus relevant structural details are omitted for simplicity.

The heating tool 500 is disposed below the chuck 204 of the wafer holding apparatus 200. In some embodiments, the heating tool 500 may include an energy source, which may include a plurality of LEDs or array(s) of LEDs arranged in zones, wherein each zone of LEDs may be separately controllable. In some other embodiments, the energy source may be a lamp augmented with LEDs strewn about areas of the lamp head that had previously not been a light-emitting surface, increasing usage of the heat source surface area.

Figure 6B:
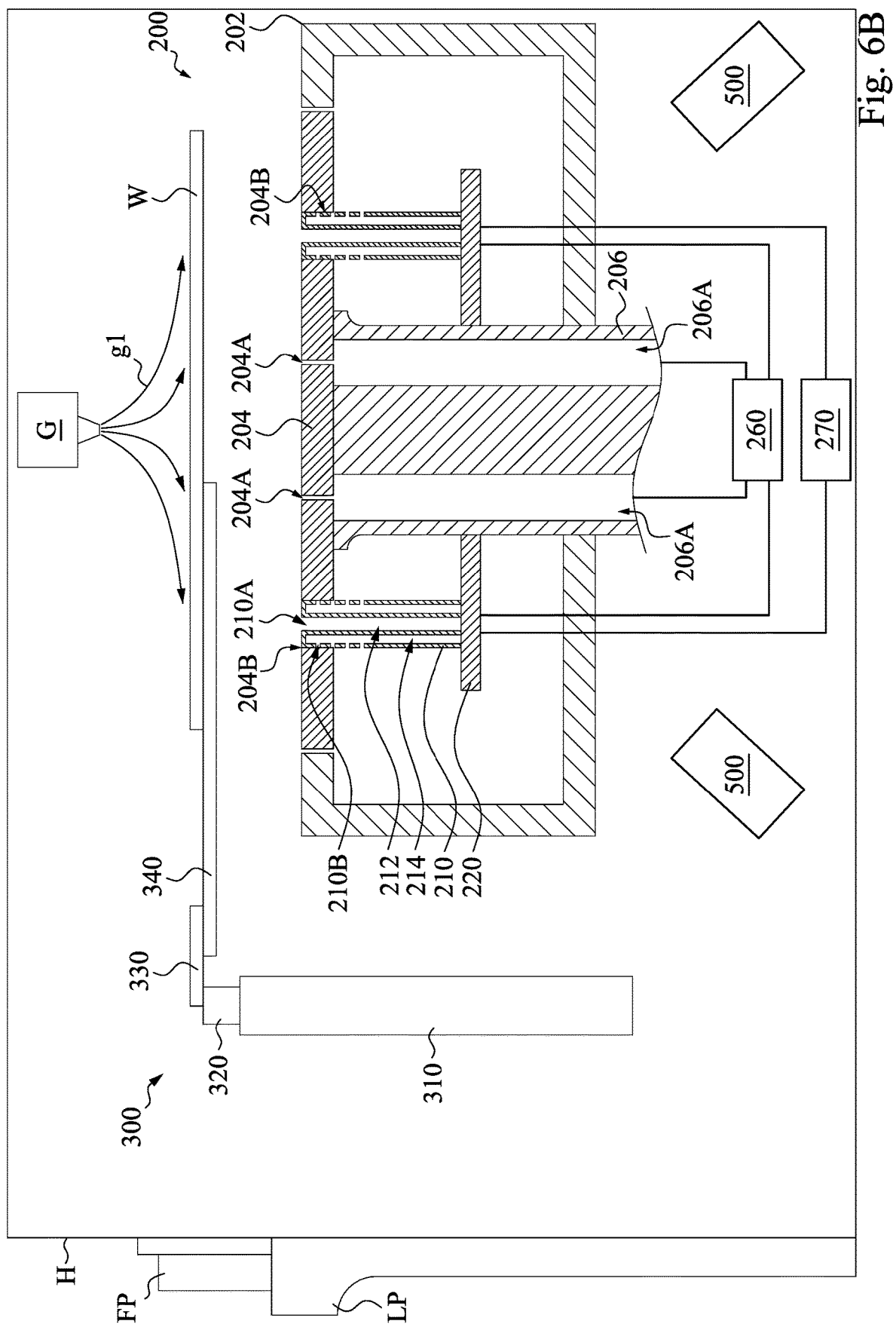
Figure 6C:
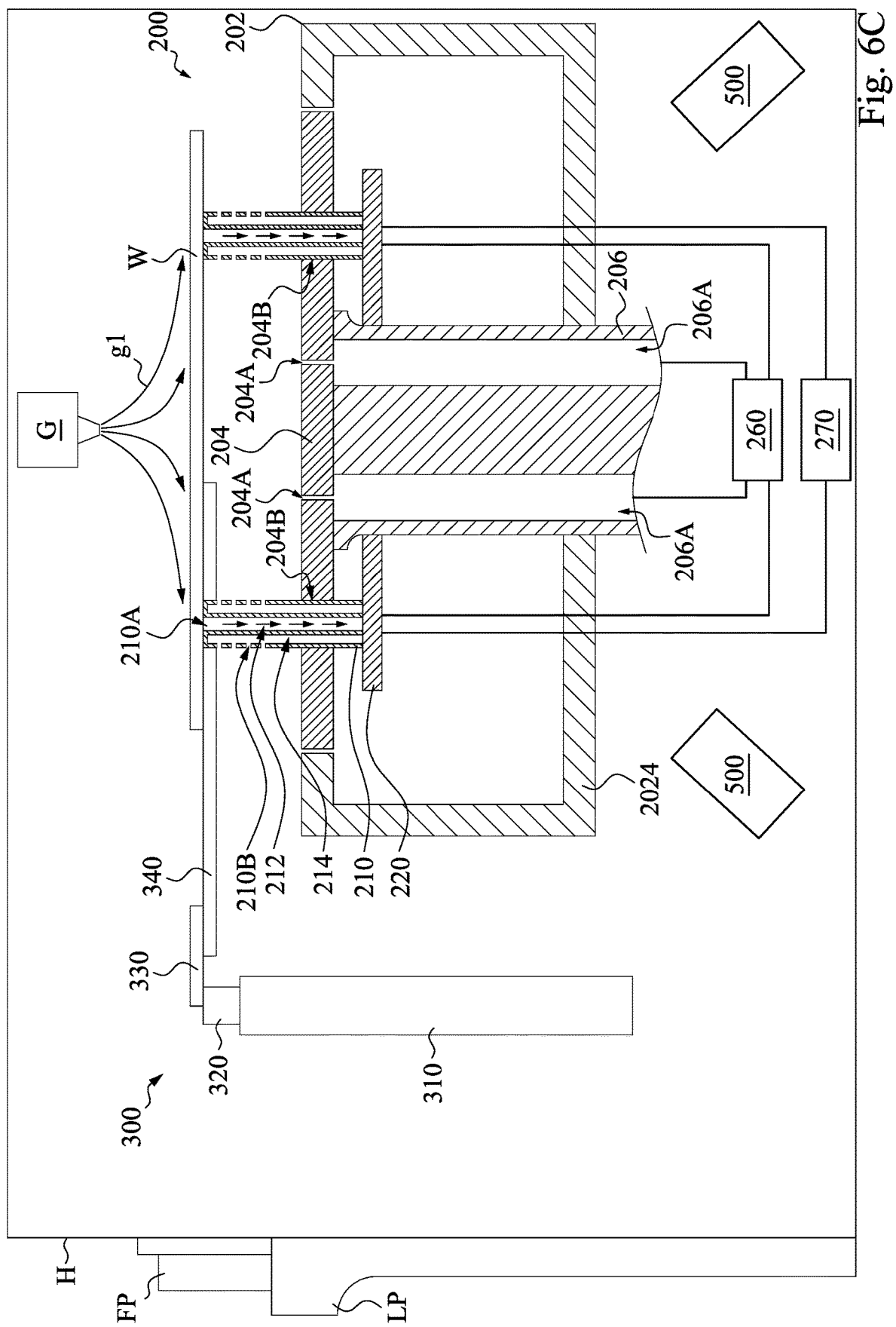
Figure 6D:
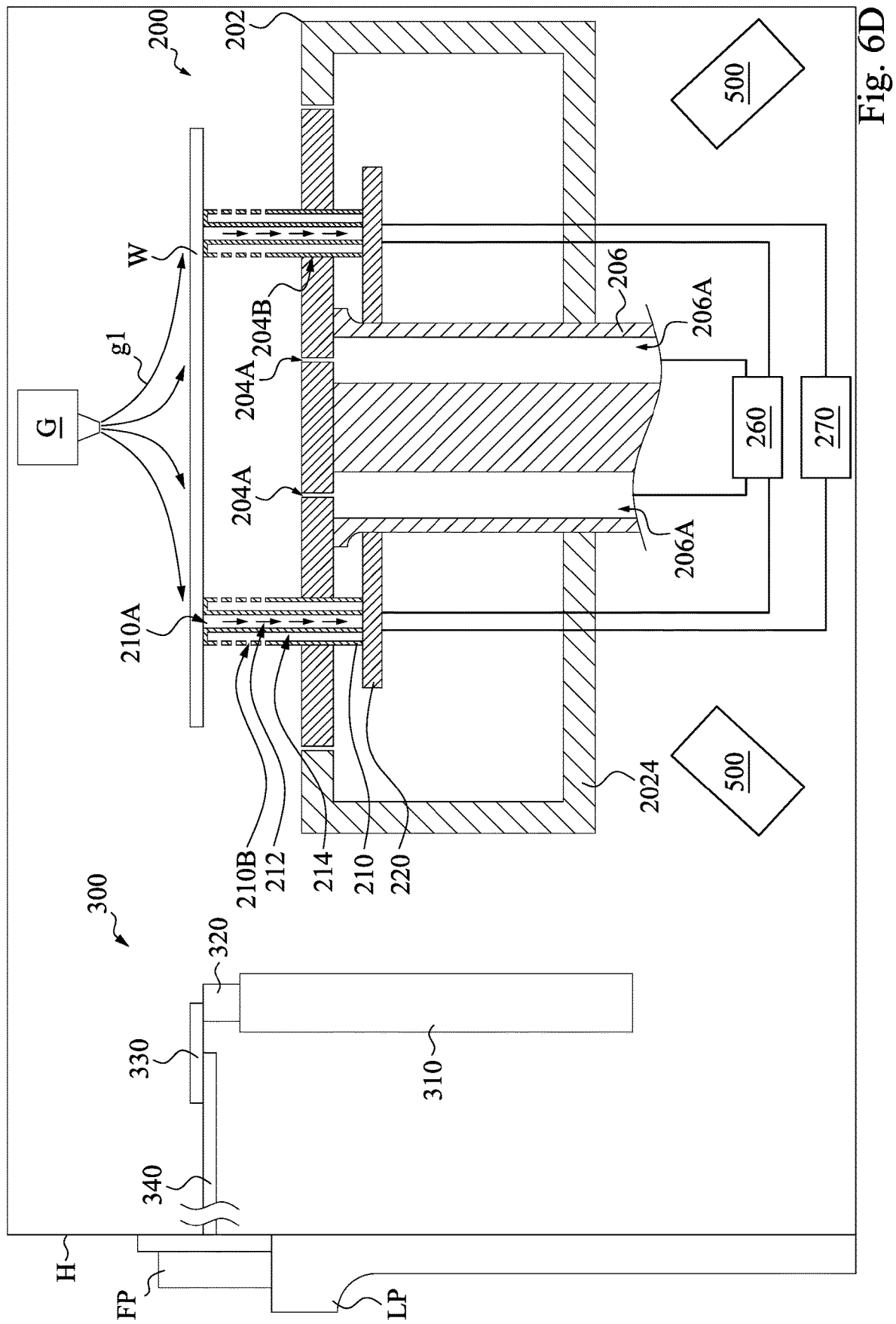
Figure 6E:
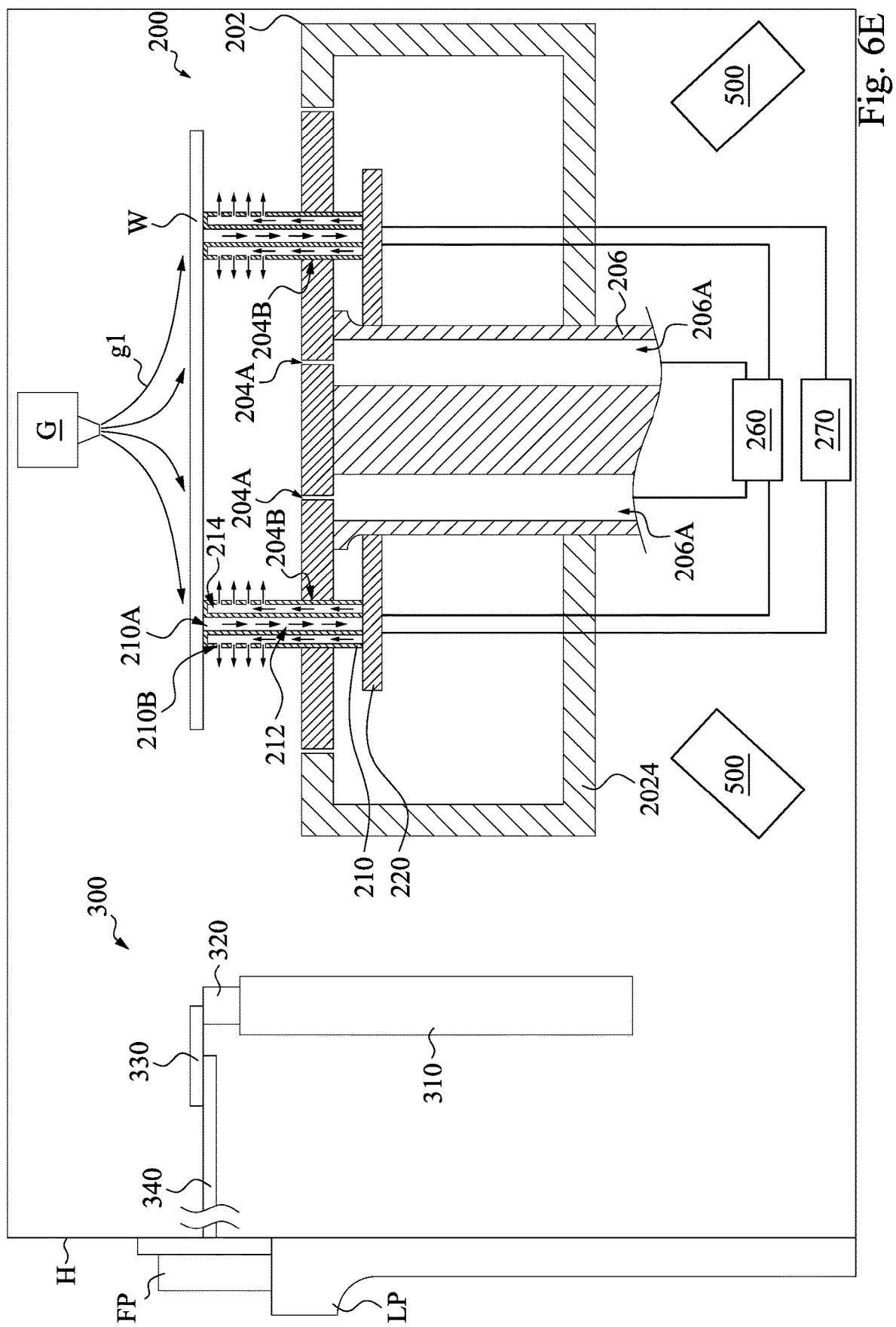
Figure 6F:
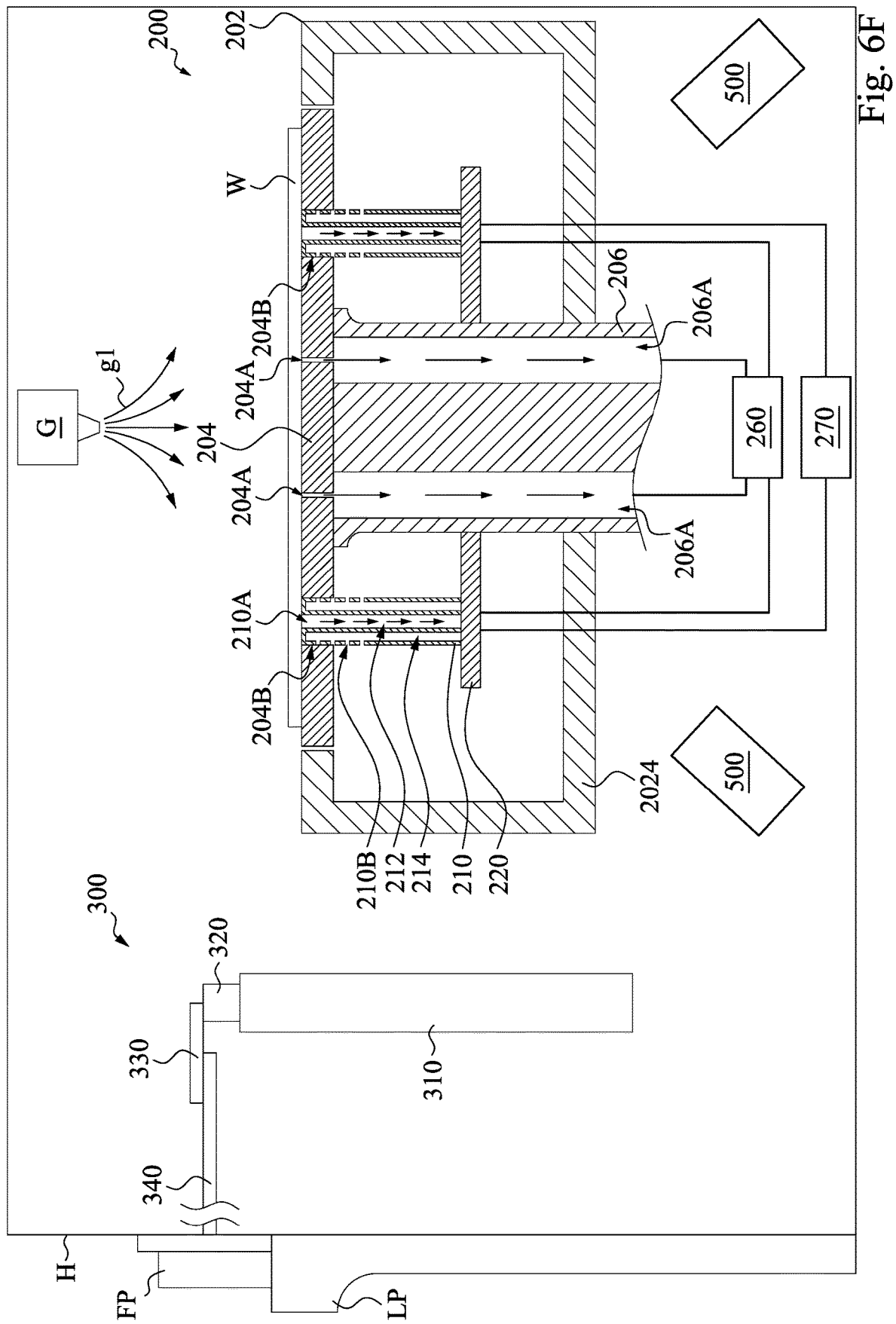

Reference is made to FIGS. 5 and 6B to 6F. In FIGS. 5 and 6B, the method 1100 begins at operation 1102 where a wafer is transferred to a wafer holding apparatus (e.g. wafer holding apparatus 200) by a wafer transfer robot (e.g. wafer transfer robot 300). Then, a purging device G may start to eject purging gas g1 downward to the wafer W, so as to prevent particles from landing on the wafer W. In FIGS. 5 and 6C, the method 1100 proceeds to operation 1104 where a plurality of lifting pins of the wafer holding apparatus are raised to receive the wafer. In FIGS. 5 and 6D, the method 1100 proceeds to operation 1106 where the wafer transfer robot is removed to release the wafer on the lifting pins. In FIGS. 5 and 6E, the method 1100 proceeds to operation 1108 where a cleaning process is performed. In FIGS. 5 and 6F, the method 1100 proceeds to operation 1110 where the lifting pins are lowered. The operations 1102 to 1110 are similar to operations 1002 to 1010 described in FIGS. 3 and 4B to 4F, and thus relevant details are omitted for simplicity.

Figure 6G:
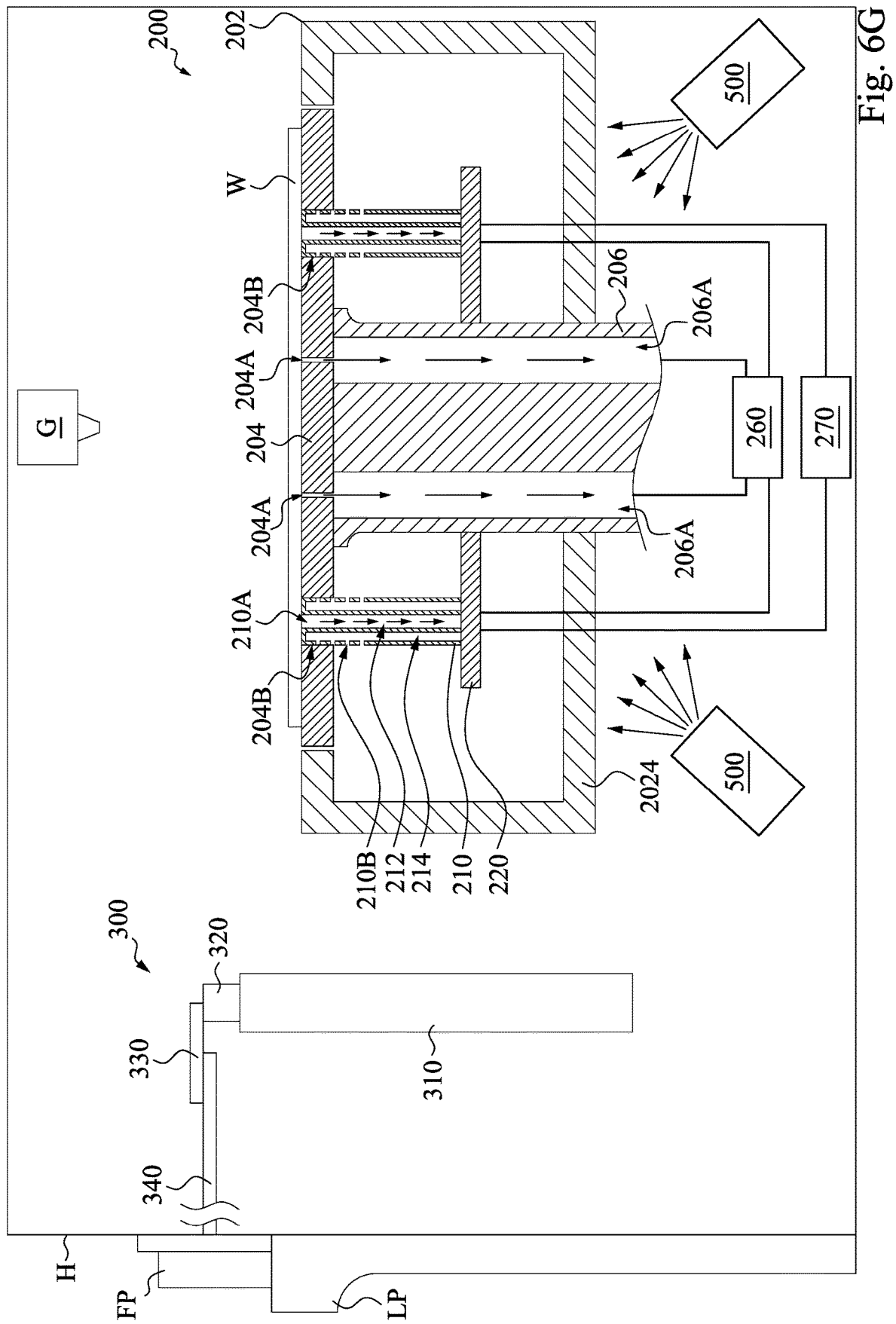

Reference is made to FIGS. 5 and 6G. The method 1100 proceeds to operation 1112 where a heating process is performed. The heating tool 500 is operating for heating the wafer W. In some other embodiments, the heating tool 500 may be used to heat the wafer W, for example, such as by being disposed below the wafer W, or by directing the radiation to the back side of the wafer W. During processing, the wafer W is disposed on the chuck 204. The heating tool 500 is a source of radiation (e.g., heat) and, in operation, generates a pre-determined temperature distribution across the wafer W. In embodiments, where the heat source includes LEDs, the heating tool 500 may provide energy in wavelengths ranging from ultraviolet wavelengths to infrared wavelengths (e.g., about 100 nanometers (nm) to about 2000 nanometers (nm)). In some embodiments, the heating tool 500 (e.g., LED array) may provide energy in the microwave wavelength range. The heating tool 500 provides heat radiation that is absorbed by the wafer W. In the exemplary process described above, the heating tool 500 may be used to illuminate and heat the surface of the wafer W. In some embodiments, the heating tool 500 may be used in conjunction with processing chambers to form films, treat dopants, change process gases (e.g., break bonds), and reorder the wafer itself.

As mentioned above, a cleaning process is performed prior to performing the heating process such that particles on the chuck 204 may be repelled. Accordingly, the interface between the wafer W and the top surface of the chuck 204 is substantially free from particles, such that the wafer W can be uniformly attached to the chuck 204. If some particles are present between the wafer W and the chuck 204, the particles may lead to air gaps between some regions of the wafer W and the chuck 204, such that these regions (equivalently referred to as first regions) are not in contact with the chuck 204, while other regions of the wafer W (equivalently referred to as second regions) remain in contact with the chuck 204. The first regions of the wafer W has higher heat dissipation than the second regions of the wafer W because of the air gaps resulting from the particles. Therefore, the first regions of the wafer W would have different temperature than the second regions of the wafer W during the heating process, which in turn lead to poor temperature uniformity during the heating process. However, since particles are blown away from the wafer, contamination to the wafer W due to the particles can be reduced, which in turn will result in improved temperature uniformity of the wafer during the heating process.

According to the aforementioned embodiments, it can be seen that the present disclosure offers advantages in fabricating semiconductor devices. It is understood, however, that other embodiments may offer additional advantages, and not all advantages are necessarily disclosed herein, and that no particular advantage is required for all embodiments. One advantage is that a plurality of openings are formed on lifting pins and are gaseously communicated with a gas source, and thus a cleaning process can be performed prior to lowering the wafer to the chuck. Another advantage is that photolithographic overlay control can be improved because of reduced particles between the wafer and the chuck. Yet another advantage is that temperature uniformity of the wafer during a thermal process can be improved because of reduced particles between the wafer and the chuck.

In some embodiments of the present disclosure, a method includes transferring a wafer to a position over a wafer chuck; lifting a lifting pin through the wafer chuck to a first position to support the wafer; holding the wafer on the lifting pin using a negative pressure source in gaseous communication with an inner gas passage of the lifting pin; introducing a gas to a region between the wafer and the wafer chuck through an outer gas passage of the lifting pin, wherein in a top view of the lifting pin, the inner gas passage has a circular profile, while the outer gas passage has a ring-shape profile; and lowering the lifting to dispose the wafer over the wafer chuck.

In some embodiments of the present disclosure, a method includes transferring a wafer to a position over a wafer chuck; lifting a lifting pin through the wafer chuck to a first position to support the wafer; introducing a gas to a region between the wafer and the wafer chuck through a first gas passage inside the lifting pin, wherein in a cross-sectional view of the lifting pin, the first gas passage has two portions laterally separated by a second gas passage inside the lifting pin; lowering the lifting to dispose the wafer over the wafer chuck; and performing a lithography process.

In some embodiments of the present disclosure, an apparatus includes a wafer chuck having a hole, a lifting pin configured to penetrate through the hole of the wafer chuck for holding a wafer, and an exposure tool disposed over the wafer chuck. The lifting pin comprises a first gas passage and a second gas passage gaseously isolated from each other, wherein in a top view of the lifting pin, the second gas passage has a ring-shape profile that encircles the first gas passage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   transferring a wafer to a position over a wafer chuck;
   lifting a lifting pin through the wafer chuck to support the wafer;
   holding the wafer on the lifting pin using a negative pressure source in gaseous communication with an inner gas passage of the lifting pin;
   introducing a gas to a region between the wafer and the wafer chuck through an outer gas passage of the lifting pin, wherein in a top view of the lifting pin, the inner gas passage has a circular profile, while the outer gas passage has a ring-shape profile; and
   lowering the lifting pin to dispose the wafer over the wafer chuck.

2. The method of claim 1, wherein the outer gas passage is in communication with an opening on a sidewall of the lifting pin.

3. The method of claim 1, wherein the inner gas passage is in communication with an opening on a top surface of the lifting pin.

4. The method of claim 1, wherein the outer gas passage in communication with a gas source.

5. The method of claim 1, further comprising performing a lithography process after the wafer is disposed over the wafer chuck.

6. The method of claim 1, wherein transferring the wafer to the position over the wafer chuck is performed by gripping the wafer using a gripper, and the method further comprises moving the gripper away from the wafer chuck prior to introducing the gas to the region between the wafer and the wafer chuck.

7. The method of claim 1, further comprising ejecting a cleaning gas from a purging device above the wafer to clean a top surface of the wafer prior to lifting the lifting pin.

8. A method, comprising:
   transferring a wafer to a position over a wafer chuck;
   lifting a lifting pin through the wafer chuck to support the wafer;
   introducing a gas to a region between the wafer and the wafer chuck through a first gas passage inside the lifting pin, wherein in a cross-sectional view of the lifting pin, the first gas passage has two portions laterally separated by a second gas passage inside the lifting pin;
   lowering the lifting pin to dispose the wafer over the wafer chuck; and
   performing a lithography process.

9. The method of claim 8, wherein in a top view of the lifting pin, the first gas passage encircles the second gas passage.

10. The method of claim 8, further comprising holding the wafer on the lifting pin using a negative pressure source in gaseous communication with the second gas passage.

11. The method of claim 8, wherein in a top view of the lifting pin, the first gas passage has a ring-shape profile.

12. The method of claim 8, wherein lowering the lifting is performed after introducing the gas to the region between the wafer and the wafer chuck.

13. The method of claim 8, wherein the lifting pin has at least one first opening on a sidewall of the lifting pin and in gaseous communication with the first gas passage.

14. The method of claim 13, wherein the lifting pin has a second opening on a top surface of the lifting pin and in gaseous communication with the second gas passage.

15. The method of claim 8, wherein the first gas passage and the second gas passage are concentrically arranged in the lifting pin.

16. An apparatus, comprising:
   a wafer chuck having a hole;
   a lifting pin configured to penetrate through the hole of the wafer chuck for holding a wafer, wherein the lifting pin comprises a first gas passage and a second gas passage gaseously isolated from each other, wherein in a top view of the lifting pin, the second gas passage has a ring-shape profile that encircles the first gas passage; and
   an exposure tool disposed over the wafer chuck.

17. The apparatus of claim 16, wherein in the top view, the first gas passage has a circular profile.

18. The apparatus of claim 16, wherein in a cross-sectional view of the lifting pin, a top end of the first gas passage is exposed by an opening on a top surface of the lifting pin.

19. The apparatus of claim 16, wherein in a cross-sectional view of the lifting pin, a top end of the second gas passage is sealed by a top wall of the lifting pin.

20. The apparatus of claim 16, wherein the first gas passage is in communication with a vacuum source, and the second gas passage is in communication with a gas source.

* * * * *